US011401612B2

(12) United States Patent
Moriyama

(10) Patent No.: US 11,401,612 B2
(45) Date of Patent: *Aug. 2, 2022

(54) SURFACE-TREATED COPPER FOIL, COPPER FOIL HAVING CARRIER, LAMINATED MATERIAL, METHOD FOR PRODUCING PRINTED WIRING BOARD, AND METHOD FOR PRODUCING ELECTRONIC APPARATUS

(71) Applicant: JX Nippon Mining & Metals Corporation, Tokyo (JP)

(72) Inventor: Terumasa Moriyama, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 335 days.

This patent is subject to a terminal disclaimer.

(21) Appl. No.: 15/888,413

(22) Filed: Feb. 5, 2018

(65) Prior Publication Data
US 2018/0228029 A1    Aug. 9, 2018

(30) Foreign Application Priority Data

Feb. 7, 2017    (JP) .............................. JP2017-020508

(51) Int. Cl.
*C23F 1/02*    (2006.01)
*H05K 3/28*    (2006.01)
(Continued)

(52) U.S. Cl.
CPC ................. *C23F 1/02* (2013.01); *C23F 1/14* (2013.01); *C23F 1/18* (2013.01); *C25D 3/04* (2013.01);
(Continued)

(58) Field of Classification Search
CPC .................................... H05K 3/28; C23F 1/02
See application file for complete search history.

(56) References Cited

U.S. PATENT DOCUMENTS 5,262,247 A * 11/1993 Kajiwara ............... H05K 3/025
428/607
5,304,428 A * 4/1994 Takami ................... C25D 3/58
428/607
(Continued)

FOREIGN PATENT DOCUMENTS

CN    104125711 A    10/2014
JP    2004-244656 A    9/2004
(Continued)

OTHER PUBLICATIONS

Office action dated Jul. 14, 2020 in co-pending U.S. Appl. No. 15/907,385.

*Primary Examiner* — Nicholas R Krasnow
(74) *Attorney, Agent, or Firm* — Nields, Lemack & Frame, LLC

(57) ABSTRACT

To provide a surface-treated copper foil that can favorably decrease the transmission loss even used in a high frequency circuit board, and has improved acid resistance. A surface-treated copper foil containing a copper foil, and a surface treatment layer containing a roughening treatment layer on at least one surface of the copper foil, wherein the surface treatment layer contains Ni, the surface treatment layer has a content ratio of Ni of 8% by mass or less (excluding 0% by mass), and an outermost surface of the surface treatment layer has a ten-point average roughness Rz of 1.4 μm or less.

19 Claims, 6 Drawing Sheets

(51) Int. Cl.
| | |
|---|---|
| H05K 1/09 | (2006.01) |
| H05K 3/46 | (2006.01) |
| C23F 1/18 | (2006.01) |
| C25D 5/14 | (2006.01) |
| C25D 3/04 | (2006.01) |
| C25D 5/48 | (2006.01) |
| H05K 3/20 | (2006.01) |
| C25D 7/06 | (2006.01) |
| C23F 1/14 | (2006.01) |
| C25D 9/08 | (2006.01) |
| C25D 5/00 | (2006.01) |
| C25D 3/38 | (2006.01) |
| H05K 3/10 | (2006.01) |
| H05K 3/06 | (2006.01) |
| C25D 3/12 | (2006.01) |
| C23C 22/24 | (2006.01) |
| H05K 1/02 | (2006.01) |
| C25D 3/56 | (2006.01) |
| C23F 4/00 | (2006.01) |

(52) U.S. Cl.
CPC ............... *C25D 5/14* (2013.01); *C25D 5/48* (2013.01); *C25D 5/605* (2020.08); *C25D 7/0614* (2013.01); *C25D 9/08* (2013.01); *H05K 1/09* (2013.01); *H05K 3/205* (2013.01); *H05K 3/28* (2013.01); *H05K 3/4652* (2013.01); *C23C 22/24* (2013.01); *C23C 2222/20* (2013.01); *C23F 4/00* (2013.01); *C25D 3/12* (2013.01); *C25D 3/38* (2013.01); *C25D 3/562* (2013.01); *H05K 1/0242* (2013.01); *H05K 3/06* (2013.01); *H05K 3/108* (2013.01); *H05K 3/4682* (2013.01); *H05K 2201/0367* (2013.01); *H05K 2203/0307* (2013.01); *H05K 2203/1311* (2013.01)

(56) References Cited

U.S. PATENT DOCUMENTS

| | | | | |
|---|---|---|---|---|
| 5,456,817 | A * | 10/1995 | Hino | C23C 22/24 |
| | | | | 148/241 |
| 5,800,930 | A * | 9/1998 | Chen | C25D 5/16 |
| | | | | 428/607 |
| 6,049,041 | A * | 4/2000 | Yoshioka | H05K 1/09 |
| | | | | 174/117 FF |
| 6,777,108 | B1 * | 8/2004 | Obata | C25D 1/04 |
| | | | | 428/624 |
| 7,842,397 | B2 * | 11/2010 | Ito | C25D 3/562 |
| | | | | 428/607 |
| 9,060,431 | B2 * | 6/2015 | Arai | C25D 5/48 |
| 2001/0014406 | A1 * | 8/2001 | Mitsuhashi | C23C 28/00 |
| | | | | 428/606 |
| 2004/0154930 | A1 | 8/2004 | Shinozaki | |
| 2006/0257680 | A1 * | 11/2006 | Kodaira | C23C 28/00 |
| | | | | 428/615 |
| 2010/0212941 | A1 * | 8/2010 | Higuchi | C25D 5/16 |
| | | | | 174/257 |
| 2010/0323214 | A1 * | 12/2010 | Muroga | H05K 1/09 |
| | | | | 428/606 |
| 2011/0189499 | A1 * | 8/2011 | Fujisawa | B32B 27/281 |
| | | | | 428/607 |
| 2012/0135266 | A1 * | 5/2012 | Kaminaga | C25D 5/14 |
| | | | | 428/624 |
| 2013/0011690 | A1 * | 1/2013 | Arai | H05K 3/20 |
| | | | | 428/548 |
| 2013/0040162 | A1 * | 2/2013 | Fujisawa | C22C 19/002 |
| | | | | 428/607 |
| 2013/0240257 | A1 * | 9/2013 | Tanaka | C23C 26/00 |
| | | | | 174/257 |
| 2014/0093743 | A1 * | 4/2014 | Arai | C25D 5/605 |
| | | | | 428/551 |
| 2015/0361584 | A1 * | 12/2015 | Chiba | C30B 29/02 |
| | | | | 117/101 |
| 2016/0062074 | A1 * | 3/2016 | Nagano | C22C 9/00 |
| | | | | 359/824 |
| 2016/0303829 | A1 | 10/2016 | Arai et al. | |
| 2016/0374205 | A1 | 12/2016 | Moriyama et al. | |
| 2017/0032978 | A1 | 2/2017 | Moriyama et al. | |
| 2018/0255646 | A1 * | 9/2018 | Moriyama | H05K 3/227 |

FOREIGN PATENT DOCUMENTS

| | | |
|---|---|---|
| JP | 4161304 B2 | 10/2008 |
| JP | 4704025 B2 | 6/2011 |
| JP | 5710737 B1 | 4/2015 |
| JP | 2017-25405 A | 2/2017 |
| KR | 2015-0021474 A | 3/2015 |
| KR | 2016-0086287 A | 7/2016 |
| KR | 2016-0149149 A | 12/2016 |
| TW | 201512467 A | 4/2015 |
| TW | 201531172 A | 8/2015 |

* cited by examiner

Surface etching treatment
(hydrogen peroxide
and sulfuric acid)

SURFACE-TREATED COPPER FOIL, COPPER FOIL HAVING CARRIER, LAMINATED MATERIAL, METHOD FOR PRODUCING PRINTED WIRING BOARD, AND METHOD FOR PRODUCING ELECTRONIC APPARATUS

TECHNICAL FIELD

The present application relates to a surface-treated copper foil, a copper foil having a carrier, a laminated material, a method for producing a printed wiring board, and a method for producing an electronic apparatus.

BACKGROUND ART

Printed wiring boards have accomplished great development over the recent half century, and have been finally used in almost all of electronic apparatuses. Associated with the increasing needs of size reduction and performance enhancement of electronic apparatuses in recent years, the components are mounted in high density, and the frequency of signal is increased, which result in the demand of the printed wiring board having excellent capability to adapt to high frequency.

A high frequency board is demanded to have a decreased transmission loss for ensuring the quality of the output signal. The transmission loss is formed mainly of a dielectric loss caused by the resin (i.e., the substrate side) and a conductor loss caused by the conductor (i.e., the copper foil side). The dielectric loss is decreased with the decrease of the dielectric constant and the dielectric loss tangent of the resin. The conductor loss of a high frequency signal is mainly caused by decreasing the cross sectional area, through which an electric current flows, due to the skin effect, in which an electric current having a higher frequency flows only the surface of the conductor, thereby increasing the resistance.

As a technique for decreasing the transmission loss of the high frequency copper foil, for example, PTL 1 describes a metal foil for a high frequency circuit containing a metal foil, silver or a silver alloy that is coated on one surface or both surfaces of the metal foil, and a coated layer other than the silver or silver alloy that is provided on the silver or silver alloy coated layer to a thickness that is smaller than the silver or silver alloy coated layer. There is also described that according to the structure, a metal foil having a decreased loss due to the skin effect in a superhigh frequency region used in the satellite communications can be provided.

PTL 2 describes a surface-roughened rolled copper foil for a high frequency circuit, in which the ratio of the integral intensity (I(200)) of the (200) plane measured by X-ray diffraction of the rolled surface of the rolled copper foil after the recrystallization annealing to the integral intensity (I0(200)) of the (200) plane measured by X-ray diffraction of the fine powder copper is I(200)/I0(200)>40, the roughened surface of the rolled surface after subjecting to the roughening treatment by electrolytic plating has an arithmetic average roughness (which may be hereinafter referred to as Ra) of from 0.02 µm to 0.2 µm and a ten-point average roughness (which may be hereinafter referred to as Rz) of from 0.1 µm to 1.5 µm, and the copper foil is a material for a printed circuit board. There is also described that according to the structure, a printed circuit board capable of being used under a high frequency exceeding 1 GHz can be provided.

PTL 3 describes an electrolytic copper foil, in which a part of the surface of the copper foil is an uneven surface constituted by knobby protrusions having a surface roughness of from 2 µm to 4 µm. There is also described that according to the structure, an electrolytic copper foil excellent in high frequency transmission characteristics can be provided.

PTL 4 describes a surface-treated copper foil having on at least one surface thereof a surface treatment layer, in which the surface treatment layer contains a roughening treatment layer, the surface treatment layer has a total deposited amount of Co, Ni, and Fe of 300 µg/dm$^2$ or less, the surface treatment layer has a Zn metal layer or an alloy treatment layer containing Zn, the surface treatment layer has a ratio of a three-dimensional surface area to a two-dimensional surface area measured with a laser microscope of from 1.0 to 1.9, at least one surface of the copper foil has a surface roughness Rz JIS of 2.2 µm or less, the surface treatment layer is formed on both surfaces of the copper foil, and the both surfaces have a surface roughness Rz JIS of 2.2 µm or less. There is also described that according to the structure, a surface-treated copper foil capable of favorably suppressing the transmission loss even used in a high frequency circuit board can be provided.

CITATION LIST

Patent Literatures

PTL 1: Japanese Patent No. 4,161,304
PTL 2: Japanese Patent No. 4,704,025
PTL 3: JP-A-2004-244656
PTL 4: Japanese Patent No. 5,710,737

SUMMARY OF INVENTION

Technical Problem

The control of the transmission loss of the copper foil used in a high frequency circuit board has been variously investigated as described above, but there is still room for development. Furthermore, there are cases where a circuit (copper wiring) is subjected to soft etching with an acid or the like in the production of a high frequency circuit board, and therefore the copper foil is still demanded to have enhanced acid resistance.

Solution to Problem

The present inventors have found that in a surface-treated copper foil containing a copper foil and a surface treatment layer containing a roughening treatment layer on one or both surfaces of the copper foil, the transmission loss can be favorably decreased even used in a high frequency circuit board, and the acid resistance thereof can be improved, by controlling the content ratio of Ni in the surface treatment layer, and the ten-point average roughness Rz of the outermost surface of the surface treatment layer.

One or more embodiments of the present application have been completed based on the aforementioned knowledge, and relate to, in one aspect, a surface-treated copper foil containing a copper foil, and a surface treatment layer containing a roughening treatment layer on at least one surface of the copper foil, wherein the surface treatment layer contains Ni, the surface treatment layer has a content ratio of Ni of 8% by mass or less (excluding 0% by mass), and an outermost surface of the surface treatment layer has a ten-point average roughness Rz of 1.4 μm or less.

In one embodiment of the surface-treated copper foil of the present application, the surface treatment layer has a total deposited amount of from 1.0 to 5.0 g/m$^2$.

In another embodiment of the surface-treated copper foil of the present application, the surface treatment layer contains Co, and the surface treatment layer has a content ratio of Co of 15% by mass or less (excluding 0% by mass).

In still another embodiment of the surface-treated copper foil of the present application, the surface treatment layer has a deposited amount of Co of from 30 to 2,000 μg/d m$^2$.

In still another embodiment of the surface-treated copper foil of the present application, the surface treatment layer contains Ni, and the surface treatment layer has a deposited amount of Ni of from 10 to 1,000 μg/dm$^2$.

In still another embodiment of the surface-treated copper foil of the present application, the surface treatment layer further contains one or more layer selected from the group consisting of a heat resistant layer, a rust preventing layer, a chromate treatment layer, and a silane coupling treatment layer.

In still another embodiment of the surface-treated copper foil of the present application, the surface-treated copper foil is used in a copper-clad laminated board or a printed wiring board for a high frequency circuit board.

The present application also relates to, in another aspect, a surface-treated copper foil having a resin layer, containing the surface-treated copper foil according to one or more embodiments of the present application, and a resin layer.

The present application also relates to, in still another aspect, a copper foil having a carrier, containing a carrier, and an intermediate layer and an ultrathin copper layer on at least one surface of the carrier, wherein the ultrathin copper layer is the surface-treated copper foil according to one or more embodiments of the present application, or the surface-treated copper foil having a resin layer according to one or more embodiments of the present application.

The present application also relates to, in still another aspect, a laminated material containing the surface-treated copper foil according to one or more embodiments of the present application, the surface-treated copper foil having a resin layer according to one or more embodiments of the present application, or the copper foil having a carrier according to one or more embodiments of the present application.

The present application also relates to, in still another aspect, a laminated material containing the copper foil having a carrier according to one or more embodiments of the present application, and a resin, wherein a part or the whole of an end face of the copper foil having a carrier is covered with the resin.

The present application also relates to, in still another aspect, a laminated material containing two of the copper foils having a carrier according to one or more embodiments of the present application.

The present application also relates to, in still another aspect, a method for producing a printed wiring board containing using the surface-treated copper foil according to one or more embodiments of the present application, the surface-treated copper foil having a resin layer according to one or more embodiments of the present application, or the copper foil having a carrier according to one or more embodiments of the present application.

The present application also relates to, in still another aspect, a method for producing a printed wiring board containing: laminating the surface-treated copper foil according to one or more embodiments of the present application or the surface-treated copper foil having a resin layer according to one or more embodiments of the present application with an insulating substrate to form a copper-clad laminated board, or laminating the copper foil having a carrier according to one or more embodiments of the present application with an insulating substrate, and then detaching the carrier of the copper foil having a carrier to form a copper-clad laminated board; and forming a circuit by any of a semi-additive method, a subtractive method, a partly additive method, and a modified semi-additive method.

The present application also relates to, in still another aspect, a method for producing a printed wiring board containing: forming a circuit on the surface-treated copper foil according to one or more embodiments of the present application on the side of the surface treatment layer, or forming a circuit on the copper foil having a carrier according to one or more embodiments of the present application on a surface on the side of the ultrathin copper layer or on a surface of the side of the carrier; forming a resin layer on the surface on the side of the surface treatment layer of the surface-treated copper foil or on the surface on the side of the ultrathin copper layer or the surface on the side of the carrier of the copper foil having a carrier, so as to embed the circuit; and after forming the resin layer, removing the surface-treated copper foil, or detaching the carrier or the ultrathin copper layer, and then removing the ultrathin copper layer or the carrier, so as to expose the circuit having been embedded in the resin layer.

The present application also relates to, in still another aspect, a method for producing a printed wiring board containing: laminating a resin substrate with the copper foil having a carrier according to one or more embodiments of the present application on a surface on the side of the carrier or on a surface on the side of the ultrathin copper layer; providing a resin layer and a circuit at least once on a surface of the copper foil having a carrier that is opposite to the surface having the resin substrate laminated; and after forming the resin layer and the circuit, detaching the carrier or the ultrathin copper layer from the copper foil having a carrier.

The present application also relates to, in still another aspect, a method for producing a printed wiring board containing: providing a resin layer and a circuit at least once on at least one surface of a laminated material containing the copper foil having a carrier according to one or more embodiments of the present application or the laminated material according to one or more embodiments of the present application; and after forming the resin layer and the circuit, detaching the carrier or the ultrathin copper layer from the copper foil having a carrier constituting the laminated material.

The present application also relates to, in still another aspect, a method for producing an electronic apparatus containing using a printed wiring board produced by the method according to one or more embodiments of the present application.

Advantageous Effects of Invention

According to one or more embodiments of the present application, a surface-treated copper foil can be provided that is capable of favorably decreasing the transmission loss even used in a high frequency circuit board and has good acid resistance.

DESCRIPTION OF EMBODIMENTS

Surface-Treated Copper Foil

Figure 1:
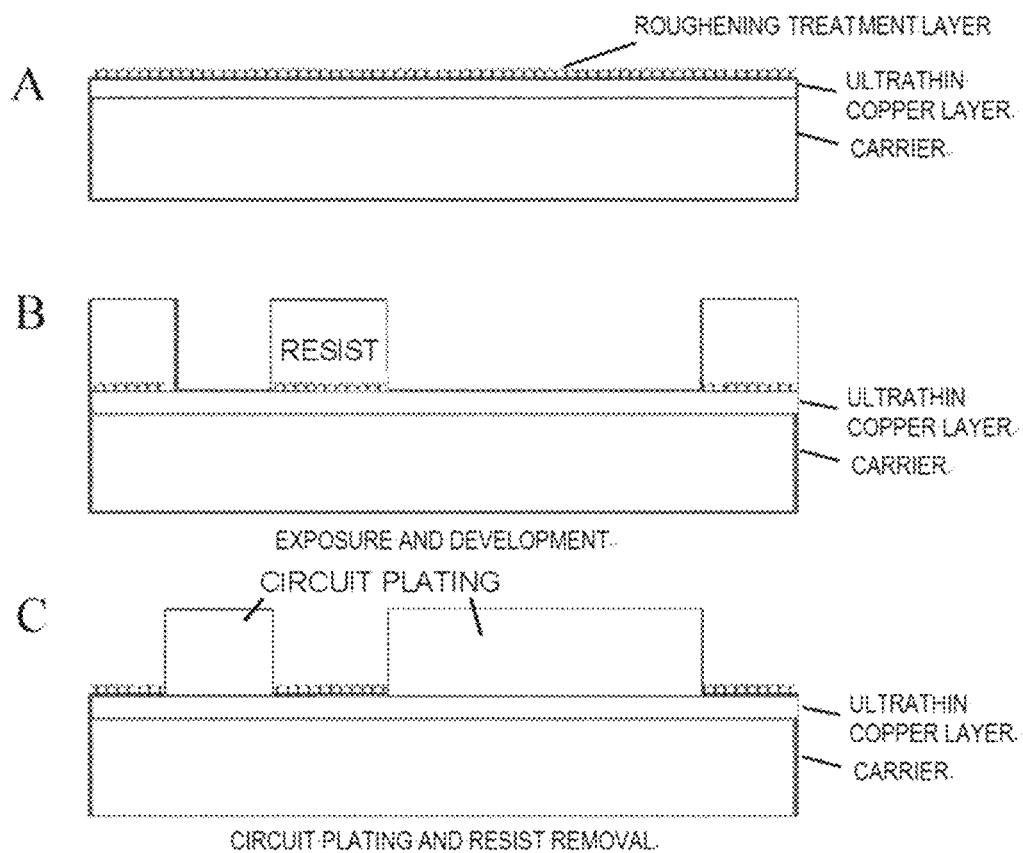
FIG. 1 is a schematic illustration of cross sections A to C of a wiring board in a specific example of a method for producing a printed circuit board using a copper foil having a carrier according to one or more embodiments of the present application, in the steps until plating of a circuit and removing a resist.

The surface-treated copper foil according to one or more embodiments of the present application contains a copper foil and a surface treatment layer on at least one surface of the copper foil, i.e., on one surface or both surfaces of the copper foil. After adhering the surface-treated copper foil according to one or more embodiments of the present application to an insulating substrate, the surface-treated copper foil may be etched to a target conductor pattern, thereby finally producing a printed wiring board. The surface-treated copper foil according to one or more embodiments of the present application may be used as a surface-treated copper foil for a high frequency circuit board. The high frequency circuit board herein means a circuit board, in which the frequency of the signal that is transferred through the circuit of the circuit board is 1 GHz or more. The frequency of the signal is preferably 3 GHz or more, more preferably 5 GHz or more, more preferably 8 GHz or more, more preferably 10 GHz or more, more preferably 15 GHz or more, more preferably 18 GHz or more, more preferably 20 GHz or more, more preferably 30 GHz or more, more preferably 38 GHz or more, more preferably 40 GHz or more, more preferably 45 GHz or more, more preferably 48 GHz or more, more preferably 50 GHz or more, more preferably 55 GHz or more, and more preferably 58 GHz or more.

Copper Foil

The form of the copper foil that can be used in one or more embodiments of the present application is not particularly limited, and typically the copper foil used in one or more embodiments of the present application may be any of an electrolytic copper foil and a rolled copper foil. In general, an electrolytic copper foil is produced by electrodepositing copper from a copper sulfate plating bath onto a drum formed of titanium or stainless steel, and a rolled copper foil is produced by repeating plastic working with a mill roll and a heat treatment. A rolled copper foil is frequently applied to a purpose that requires flexibility.

Examples of the material used for the copper foil include a high purity copper material, such as tough pitch copper (JIS H3100, alloy number: C1100), oxygen-free copper (JIS H3100, alloy number: C1020, or JIS H3510, alloy number: C1011), phosphorus-deoxidized copper (JIS H3100, alloy number: C1201, C1220, or C1221), and electrolytic copper, which is usually used as a conductor pattern of a printed wiring board, and also include a copper alloy, such as Sn-containing copper, Ag-containing copper, a copper alloy having added thereto Sn, Ag, In, Au, Cr, Fe, P, Ti, Sn, Zn, Mn, Mo, Co, Ni, Si, Zr, P, and/or Mg, and the like, and a Corson copper alloy containing Ni, Si, and the like. A copper foil and a copper alloy foil each having a known composition may also be used. In the description herein, the term "copper foil" used solely encompasses a copper alloy foil.

The thickness of the copper foil is not necessarily particularly limited, and may be, for example, from 1 to 1,000 μm, from 1 to 500 μm, from 1 to 300 μm, from 3 to 100 μm, from 5 to 70 μm, from 6 to 35 μm, or from 9 to 18 μm.

The present application also relates to, in another aspect, a copper foil having a carrier, containing a carrier, and an intermediate layer and an ultrathin copper layer in this order on at least one surface of the carrier, i.e., on one surface or both surfaces of the carrier, wherein the ultrathin copper layer is the surface-treated copper foil according to one or more embodiments of the present application. In the case where the copper foil having a carrier is used in one or more embodiments of the present application, a surface treatment layer, such as a roughening treatment layer shown below, is provided on the ultrathin copper layer surface. Other embodiments of the copper foil having a carrier will be described later.

Surface Treatment Layer

The surface treatment layer of the surface-treated copper foil according to one or more embodiments of the present application contains Ni. In the case where the surface treatment layer of the surface-treated copper foil contains Ni, an effect of enhancing the acid resistance is provided. When the content ratio of Ni in the surface treatment layer is 8% by mass or less (excluding 0% by mass), the high frequency transmission characteristics can be further enhanced. When the content ratio of Ni exceeds 8% by mass, there may be a problem of deterioration of the high frequency transmission characteristics of the surface-treated copper foil in some cases. The content ratio of Ni in the surface treatment layer is preferably 7.5% by mass or less, more preferably 7% by mass or less, more preferably 6.5% by mass or less, more preferably 6% by mass or less, more preferably 5.5% by mass or less, more preferably 5% by mass or less, more preferably 4.8% by mass or less, more preferably 4.5% by mass or less, more preferably 4.2% by mass or less, more preferably 4.0% by mass or less, more preferably 3.8% by mass or less, more preferably 3.5% by mass or less, more preferably 3.0% by mass or less, more preferably 2.5% by mass or less, more preferably 2.0% by mass or less, more preferably 1.9% by mass or less, and further preferably 1.8% by mass or less. From the standpoint of the acid resistance, the content ratio of Ni in the surface treatment layer is preferably 0% by mass or more, preferably more than 0% by mass, preferably 0.01% by mass or more, preferably 0.02% by mass or more, preferably 0.03% by mass or more, preferably 0.04% by mass or more, preferably 0.05% by mass or more, preferably 0.06% by mass or more, preferably 0.07% by mass or more, preferably 0.08% by mass or more, preferably 0.09% by mass or more, preferably 0.10% by mass or more, preferably 0.11% by mass or more, preferably 0.15% by mass or more, preferably 0.18% by mass or more, preferably 0.20% by mass or more, preferably 0.25% by mass or more, preferably 0.50% by mass or more, preferably 0.80% by mass or more, preferably 0.90% by mass or more, preferably 1.0% by mass or more, preferably 1.1% by mass or more, preferably 1.2% by mass or more, preferably 1.3% by mass or more, preferably 1.4% by mass or more, and preferably 1.5% by mass or more.

The deposited amount of Ni in the surface treatment layer is preferably 10 $\mu g/dm^2$ or more. When the deposited amount of Ni is 10 $\mu g/dm^2$ or more, the acid resistance of the surface-treated copper foil can be further enhanced in some cases. The deposited amount of Ni in the surface treatment layer is preferably 1,000 $\mu g/dm^2$ or less. When the deposited amount of Ni is 1,000 $\mu g/dm^2$ or less, the high frequency transmission characteristics are further enhanced in some cases. From the standpoint of the acid resistance of the surface-treated copper foil, the deposited amount of Ni is preferably 20 $\mu g/dm^2$ or more, 30 $\mu g/dm^2$ or more, preferably 40 $\mu g/dm^2$ or more, preferably 50 $\mu g/dm^2$ or more, preferably 55 $\mu g/dm^2$ or more, preferably 60 $\mu g/dm^2$ or more, preferably 70 $\mu g/dm^2$ or more, preferably 75 $\mu g/dm^2$ or more, preferably 100 $\mu g/dm^2$ or more, preferably 110 $\mu g/dm^2$ or more, preferably 120 $\mu g/dm^2$ or more, preferably 130 $\mu g/dm^2$ or more, preferably 140 $\mu g/dm^2$ or more, preferably 160 $\mu g/dm^2$ or more, preferably 180 $\mu g/dm^2$ or more, preferably 200 $\mu g/dm^2$ or more, preferably 220 $\mu g/dm^2$ or more, preferably 240 $\mu g/dm^2$ or more, preferably 260 $\mu g/dm^2$ or more, preferably 280 $\mu g/dm^2$ or more, and preferably 530 $\mu g/dm^2$ or more. From the standpoint of the high frequency transmission characteristics of the surface-treated copper foil, the deposited amount of Ni is preferably 950 $\mu g/dm^2$ or less, preferably 900 $\mu g/dm^2$ or less, preferably 850 $\mu g/dm^2$ or less, preferably 800 $\mu g/dm^2$ or less, preferably 750 $\mu g/dm^2$ or less, preferably 700 $\mu g/dm^2$ or less, preferably 650 $\mu g/dm^2$ or less, preferably 600 $\mu g/dm^2$ or less, preferably 550 $\mu g/dm^2$ or less, preferably 500 $\mu g/dm^2$ or less, preferably 450 $\mu g/dm^2$ or less, preferably 400 $\mu g/dm^2$ or less, preferably 350 $\mu g/dm^2$ or less, preferably 300 $\mu g/dm^2$ or less, preferably 250 $\mu g/dm^2$ or less, preferably 200 $\mu g/dm^2$ or less, preferably 180 $\mu g/dm^2$ or less, preferably 160 $\mu g/dm^2$ or less, preferably 150 $\mu g/dm^2$ or less, preferably 140 $\mu g/dm^2$ or less, preferably 130 $\mu g/dm^2$ or less, preferably 125 $\mu g/dm^2$ or less, preferably 120 $\mu g/dm^2$ or less, preferably 115 $\mu g/dm^2$ or less, preferably 110 $\mu g/dm^2$ or less, preferably 105 $\mu g/dm^2$ or less, preferably 100 $\mu g/dm^2$ or less, preferably 95 $\mu g/dm^2$ or less, preferably 90 $\mu g/dm^2$ or less, preferably 85 $\mu g/dm^2$ or less, and preferably 80 $\mu g/dm^2$ or less.

The surface treatment layer of the surface-treated copper foil according to one or more embodiments of the present application preferably contains Co, and the content ratio of Co in the surface treatment layer is preferably 15% by mass or less (excluding 0% by mass). When the content ratio of Co is 15% by mass or less, the high frequency transmission characteristics can be further enhanced in some cases. The content ratio of Co is more preferably 14% by mass or less, more preferably 13% by mass or less, more preferably 12% by mass or less, more preferably 11% by mass or less, more preferably 10% by mass or less, more preferably 9% by mass or less, more preferably 8% by mass or less, more preferably 7.5% by mass or less, more preferably 7% by mass or less, further preferably 6.5% by mass or less, further preferably 6.0% by mass or less, and further preferably 5.5% by mass or less. When the surface treatment layer of the surface-treated copper foil contains Co, the fine circuit formation capability may be enhanced in some cases. The content ratio of Co in the surface treatment layer is preferably 0% by mass or more, preferably more than 0% by mass, preferably 0.01% by mass or more, preferably 0.02% by mass or more, preferably 0.03% by mass or more, preferably 0.05% by mass or more, preferably 0.09% by mass or more, preferably 0.1% by mass or more, preferably 0.11% by mass or more, preferably 0.15% by mass or more, preferably 0.18% by mass or more, preferably 0.2% by mass or more, preferably 0.3% by mass or more, preferably 0.5% by mass or more, preferably 0.8% by mass or more, preferably 0.9% by mass or more, preferably 1.0% by mass or more, preferably 1.5% by mass or more, preferably 2.0% by mass or more, preferably 2.5% by mass or more, preferably 3.0% by mass or more, preferably 3.5% by mass or more, preferably 4.0% by mass or more, and preferably 4.5% by mass or more.

The deposited amount of Co in the surface treatment layer is preferably 30 $\mu g/dm^2$ or more. When the deposited amount of Co is 30 $\mu g/dm^2$ or more, the solubility in an etching solution in the production of a circuit may be enhanced in some cases, and the fine circuit formation capability may be enhanced in some cases. The deposited amount of Co in the surface treatment layer is preferably 2,000 $\mu g/dm^2$ or less. When the deposited amount of Co is 2,000 $\mu g/dm^2$ or less, the high frequency transmission characteristics can be further enhanced in some cases. From the standpoint of the fine circuit formation capability of the surface-treated copper foil, the deposited amount of Co is preferably 35 $\mu g/dm^2$ or more, preferably 40 $\mu g/dm^2$ or more, preferably 45 $\mu g/dm^2$ or more, preferably 50 $\mu g/dm^2$ or more, preferably 55 $\mu g/dm^2$ or more, preferably 60 $\mu g/dm^2$ or more, preferably 70 $\mu g/dm^2$ or more, preferably 80 $\mu g/dm^2$ or more, preferably 90 $\mu g/dm^2$ or more, preferably 100 $\mu g/dm^2$ or more, preferably 150 $\mu g/dm^2$ or more, preferably 200 $\mu g/dm^2$ or more, preferably 250 $\mu g/dm^2$ or more, preferably 300 $\mu g/dm^2$ or more, preferably 350 $\mu g/dm^2$ or more, preferably 400 $\mu g/dm^2$ or more, preferably 450 $\mu g/dm^2$ or more, preferably 500 $\mu g/dm^2$ or more, preferably 550 $\mu g/dm^2$ or more, preferably 600 $\mu g/dm^2$ or more, preferably 650 $\mu g/dm^2$ or more, preferably 700 $\mu g/dm^2$ or more, and preferably 940 $\mu g/dm^2$ or more. From the standpoint of the high frequency transmission characteristics of the surface-treated copper foil, the deposited amount of Co in the surface treatment layer is preferably 1,950 $\mu g/dm^2$ or less, preferably 1,900 $\mu g/dm^2$ or less, preferably 1,850 $\mu g/dm^2$ or less, preferably 1,800 $\mu g/dm^2$ or less, preferably 1,750 $\mu g/dm^2$ or less, preferably 1,700 $\mu g/dm^2$ or less, preferably 1,650 $\mu g/dm^2$ or less, preferably 1,600 $\mu g/dm^2$ or less, preferably 1,550 $\mu g/dm^2$ or less, preferably 1,500 $\mu g/dm^2$ or less, preferably 1,450 $\mu g/dm^2$ or less, preferably 1,400 $\mu g/dm^2$ or less, preferably 1,350 $\mu g/dm^2$ or less, preferably 1,300 $\mu g/dm^2$ or less, preferably 1,250 $\mu g/dm^2$ or less, preferably 1,200 $\mu g/dm^2$ or less, preferably 1,150 $\mu g/dm^2$ or less, preferably 1,100 $\mu g/dm^2$ or less, preferably 1,050 $\mu g/dm^2$ or less, preferably 1,000 $\mu g/dm^2$ or less, preferably 950 $\mu g/dm^2$ or less, preferably 900 $\mu g/dm^2$ or less, preferably 730 $\mu g/dm^2$ or less, preferably 700 $\mu g/dm^2$ or less, preferably 600 $\mu g/dm^2$ or less, preferably 570 $\mu g/dm^2$ or less, preferably 550 $\mu g/dm^2$ or less, preferably 500 $\mu g/dm^2$ or less, and preferably 475 $\mu g/dm^2$ or less.

In the surface-treated copper foil according to one or more embodiments of the present application, the total deposited amount of the surface treatment layer is preferably 1.0 $g/m^2$ or more. The total deposited amount of the surface treatment layer is the total amount of the deposited amounts of the elements constituting the surface treatment layer. Examples of the elements constituting the surface treatment layer include Cu, Ni, Co, Cr, Zn, W, As, Mo, P, and Fe. When the total deposited amount of the surface treatment layer is 1.0 g/m$^2$ or more, the adhesiveness between the surface-treated copper foil and a resin can be enhanced in some cases. The total deposited amount of the surface treatment layer is preferably 5.0 g/m$^2$ or less. When total deposited amount of the surface treatment layer is 5.0 g/m$^2$ or less, the high frequency transmission characteristics can be further enhanced in some cases. From the standpoint of the adhesiveness between the surface-treated copper foil and a resin, the total deposited amount of the surface treatment layer is preferably 1.05 g/m$^2$ or more, preferably 1.1 g/m$^2$ or more, preferably 1.15 g/m$^2$ or more, preferably 1.2 g/m$^2$ or more, preferably 1.25 g/m$^2$ or more, preferably 1.3 g/m$^2$ or more, preferably 1.35 g/m$^2$ or more, preferably 1.4 g/m$^2$ or more, and preferably 1.5 g/m$^2$ or more. From the standpoint of the high frequency transmission characteristics of the surface-treated copper foil, the total deposited amount of the surface treatment layer is preferably 4.8 g/m$^2$ or less, preferably 4.6 g/m$^2$ or less, preferably 4.5 g/m$^2$ or less, preferably 4.4 g/m$^2$ or less, preferably 4.3 g/m$^2$ or less, preferably 4.0 g/m$^2$ or less, preferably 3.5 g/m$^2$ or less, preferably 3.0 g/m$^2$ or less, preferably 2.5 g/m$^2$ or less, preferably 2.0 g/m$^2$ or less, preferably 1.9 g/m$^2$ or less, preferably 1.8 g/m$^2$ or less, preferably 1.7 g/m$^2$ or less, preferably 1.65 g/m$^2$ or less, preferably 1.60 g/m$^2$ or less, preferably 1.55 g/m$^2$ or less, preferably 1.50 g/m$^2$ or less, preferably 1.45 g/m$^2$ or less, further preferably 1.43 g/dm$^2$ or less, and further preferably 1.4 g/m$^2$ or less.

In the case where the surface treatment layers are present on both surfaces of the copper foil in one or more embodiments of the present application, the total deposited amount of the surface treatment layer, and the content of Co, the content of Ni, and the deposited amounts of the elements, such as Co and Ni, in the surface treatment layer each are the definition for the surface treatment layer on one of the surfaces, and each are not a total value of the element (such as Co) contained in the surface treatment layers formed on both surfaces thereof.

The total deposited amount of the surface treatment layer, the deposited amount of the element (Co and/or Ni) contained in the surface treatment layer, the content of Co in the surface treatment layer, and the content of Ni in the surface treatment layer can be larger and/or increased in such a manner that the concentration of the element in the surface treatment solution used for forming the surface treatment layer is increased, and/or the current density is increased in the case where the surface treatment is plating, and/or the surface treatment time (i.e., the electrification time in plating) is prolonged. The total deposited amount of the surface treatment layer, the deposited amount of the element (Co and/or Ni) contained in the surface treatment layer, the content of Co in the surface treatment layer, and the content of Ni in the surface treatment layer can be smaller and/or decreased in such a manner that the concentration of the element in the surface treatment solution used for forming the surface treatment layer is decreased, and/or the current density is decreased in the case where the surface treatment is plating, and/or the surface treatment time (i.e., the electrification time in plating) is shortened.

In the surface-treated copper foil according to one or more embodiments of the present application, the outermost surface of the surface treatment layer has a ten-point average roughness Rz of 1.4 μm or less. When the ten-point average roughness Rz of the outermost surface of the surface treatment layer exceeds 1.4 μm, there may be a problem of deterioration of the high frequency transmission characteristics in some cases. The ten-point average roughness Rz of the outermost surface of the surface treatment layer is more preferably 1.3 μm or less, more preferably 1.2 μm or less, further preferably 1.1 μm or less, further preferably 1.0 μm or less, further preferably 0.9 μm or less, and further preferably 0.8 μm or less. In the case where the surface treatment layer is formed of plural layers formed by a surface treatment, the "outermost surface of the surface treatment layer" means the surface of the most outside (outermost) layer of the plural layers. The surface of the most outside (outermost) layer of the plural layers is measured for the ten-point average roughness Rz. The lower limit of the ten-point average roughness Rz of the outermost surface of the surface treatment layer may not be particularly limited, and is typically, for example, 0.01 μm or more, for example, 0.05 μm or more, and for example, 0.1 μm or more.

The ten-point average roughness Rz of the outermost surface of the surface treatment layer can be increased in such a manner that the current density is increased, and/or the surface treatment time (i.e., the electrification time in plating) is prolonged, in the case where the surface treatment is plating. The ten-point average roughness Rz of the outermost surface of the surface treatment layer can be decreased in such a manner that the current density is decreased, and/or the surface treatment time (i.e., the electrification time in plating) is shortened, in the case where the surface treatment is plating.

The surface treatment layer of the surface-treated copper foil according to one or more embodiments of the present application has a roughening treatment layer. The roughening treatment layer is generally formed on the surface of the copper foil, which is to be adhered to a resin substrate, i.e., the roughened surface, for the purpose of enhancing the peel strength of the copper foil after laminating, by performing electrodeposition in the form of "knobby bumps" on the surface of the copper foil after degreasing. Ordinary copper plating or the like may be performed in some cases as a pretreatment before roughening, and ordinary copper plating or the like may be performed in some cases for preventing the electrodeposited material from being detached, as a finishing treatment after roughening. In one or more embodiments of the present application, the "roughening treatment" encompasses the pretreatment and the finishing treatment.

The roughening treatment layer in the surface-treated copper foil according to one or more embodiments of the present application can be produced, for example, by forming primary particles and then forming secondary particles under the following conditions.

Plating Condition for Primary Particles
    Examples of the plating condition of the primary particles include the following.
    Composition of solution: copper: 10 to 20 g/L, sulfuric acid: 50 to 100 g/L
    Solution temperature: 25 to 50° C.
    Current density: 1 to 58 A/dm$^2$
    Coulomb amount: 1.5 to 70 As/dm$^2$
Plating Condition for Secondary Particles
    Examples of the plating condition of the secondary particles include the following.
    Composition of solution: copper: 10 to 20 g/L, nickel: 5 to 15 g/L, cobalt: 5 to 15 g/L pH: 2 to 3
    Solution temperature: 30 to 50° C.

Current density: 20 to 50 A/dm$^2$

Coulomb amount: 12 to 50 As/dm$^2$

The surface treatment layer may have one or more layer selected from the group consisting of a heat resistant layer, a rust preventing layer, a chromate treatment layer, and a silane coupling treatment layer. The heat resistant layer, the rust preventing layer, the chromate treatment layer, and the silane coupling treatment layer each may be formed of plural layers (for example, two or more layers or three or more layers) formed therein. The surface treatment layer may also have an alloy layer formed of Ni and one or more element selected from the group consisting of Fe, Cr, Mo, Zn, Ta, Cu, Al, P, W, Mn, Sn, As, and Ti, and/or a chromate treatment layer, and/or a silane coupling treatment layer, and/or a Ni—Zn alloy layer.

The heat resistant layer and the rust preventing layer used may be a known heat resistant layer and a known rust preventing layer respectively. For example, the heat resistant layer and/or the rust preventing layer may be a layer containing one or more element selected from the group consisting of nickel, zinc, tin, cobalt, molybdenum, copper, tungsten, phosphorus, arsenic, chromium, vanadium, titanium, aluminum, gold, silver, a platinum group element, iron, and tantalum, and may also be a metal layer or an alloy layer formed of one or more element selected from the group consisting of nickel, zinc, tin, cobalt, molybdenum, copper, tungsten, phosphorus, arsenic, chromium, vanadium, titanium, aluminum, gold, silver, a platinum group element, iron, and tantalum. The heat resistant layer and/or the rust preventing layer may contain an oxide, a nitride, and a silicide containing the aforementioned elements. The heat resistant layer and/or the rust preventing layer may be a layer containing a nickel-zinc alloy. The heat resistant layer and/or the rust preventing layer may be a nickel-zinc alloy layer. The nickel-zinc alloy layer may contain from 50 to 99% by weight of nickel and from 50 to 1% by weight of zinc except for unavoidable impurities. The total deposited amount of zinc and nickel of the nickel-zinc alloy layer may be from 5 to 1,000 mg/m$^2$, preferably from 10 to 500 mg/m$^2$, and preferably from 20 to 100 mg/m$^2$. The ratio of the deposited amount of nickel and the deposited amount of zinc (=(deposited amount of nickel)/(deposited amount of zinc)) of the layer containing a nickel-zinc alloy or the nickel-zinc alloy layer is preferably from 1.5 to 10. The deposited amount of nickel of the layer containing a nickel-zinc alloy or the nickel-zinc alloy layer is preferably from 0.5 mg/m$^2$ to 500 mg/m$^2$, and more preferably from 1 mg/m$^2$ to 50 mg/m$^2$. In the case where the heat resistant layer and/or the rust preventing layer is the layer containing a nickel-zinc alloy, the interface between the copper foil and a resin substrate is prevented from being corroded with a desmear solution when the inner wall of the through hole or the via hole is in contact with the desmear solution, and thus the adhesiveness between the copper foil and the resin substrate can be enhanced.

For example, the heat resistant layer and/or the rust preventing layer may be a layer containing a nickel or nickel alloy layer having a deposited amount of from 1 mg/m$^2$ to 100 mg/m$^2$, and preferably from 5 mg/m$^2$ to 50 mg/m$^2$, and a tin layer having a deposited amount of from 1 mg/m$^2$ to 80 mg/m$^2$, preferably from 5 mg/m$^2$ to 40 mg/m$^2$, which are laminated sequentially, and the nickel alloy layer may be constituted by any one of a nickel-molybdenum alloy, a nickel-zinc alloy, a nickel-molybdenum-zinc alloy, and a nickel-tin alloy.

The chromate treatment layer herein means a layer treated with a liquid containing chromic anhydride, chromic acid, dichromic acid, a chromate salt, or a dichromate salt. The chromate treatment layer may contain such an element as Co, Fe, Ni, Mo, Zn, Ta, Cu, Al, P, W, Sn, As, Ti, and the like (which may be in any form of a metal, an alloy, an oxide, a nitride, a sulfide, and the like). Specific examples of the chromate treatment layer include a chromate treatment layer that is treated with an aqueous solution of chromic anhydride or potassium dichromate, and a chromate treatment layer that is treated with a treatment liquid containing chromic anhydride or potassium dichromate and zinc.

The silane coupling treatment layer may be formed by using a known silane coupling agent, and may be formed by using such a silane coupling agent as an epoxy silane, an amino silane, a methacryloxy silane, a mercapto silane, a vinyl silane, an imidazole silane, a triazine silane, and the like. The silane coupling agent used may be a mixture of two or more kinds thereof. Among these, the silane coupling treatment layer is preferably formed by using an amino silane coupling agent or an epoxy silane coupling agent.

The surface of the copper foil, the ultrathin copper layer, the roughening treatment layer, the heat resistant layer, the rust preventing layer, the silane coupling treatment layer, or the chromate treatment layer may be subjected to a known surface treatment.

Transmission Loss

With a small transmission loss, the signal attenuation in signal transmission with a high frequency wave is suppressed, and thus stable signal transmission can be performed in a circuit, in which signal transmission is performed with a high frequency wave. Therefore, the value of the transmission loss of the copper foil is preferably smaller since the copper foil can be suitably applied to a purpose of a circuit for signal transmission with a high frequency wave. In the case where the surface-treated copper foil is adhered to a commercially available liquid crystal polymer resin (Vecstar CTZ, produced by Kuraray Co., Ltd., thickness: 50 μm, a resin formed of a copolymer of hydroxybenzoic acid (ester) and hydroxy naphthoic acid (ester)), and formed into a microstrip line by etching to have a characteristic impedance of 50Ω, and the microstrip line is measured for a permeability coefficient with a network analyzer, HP 8720C, produced by Hewlett-Packard Corporation, to provide a transmission loss at a frequency of 40 GHz, the transmission loss at a frequency of 40 GHz is preferably less than 7.5 dB/10 cm, more preferably less than 7.3 dB/10 cm, more preferably less than 7.1 dB/10 cm, more preferably less than 7.0 dB/10 cm, more preferably less than 6.9 dB/10 cm, more preferably less than 6.8 dB/10 cm, more preferably less than 6.7 dB/10 cm, more preferably less than 6.6 dB/10 cm, and further preferably less than 6.5 dB/10 cm.

Copper Foil Having Carrier

The copper foil having a carrier as another embodiment of the present application contains a carrier, and an intermediate layer and an ultrathin copper layer in this order on at least one surface of the carrier, i.e., on one surface or both surfaces of the carrier. The ultrathin copper layer is the surface-treated copper foil as one embodiment of the present application.

Carrier

The carrier that can be used in one or more embodiments of the present application is typically a metal foil or a resin film, and is supplied in the form, for example, of a copper foil, a copper alloy foil, a nickel foil, a nickel alloy foil, an iron foil, an iron alloy foil, a stainless foil, an aluminum foil, an aluminum alloy foil, an insulating resin film, a polyimide film, an LCP (liquid crystal polymer) film, a fluorine resin film, a PET (polyethylene terephthalate) film, a PP (polypropylene) film, a polyamide film, or a polyamideimide film.

The carrier that can be used in one or more embodiments of the present application is typically supplied in the form of a rolled copper foil or an electrolytic copper foil. In general, an electrolytic copper foil is produced by electrodepositing copper from a copper sulfate plating bath onto a drum formed of titanium or stainless steel, and a rolled copper foil is produced by repeating plastic working with a mill roll and a heat treatment. Examples of the material used for the copper foil include a high purity copper material, such as tough pitch copper (JIS H3100, alloy number: C1100), oxygen-free copper (JIS H3100, alloy number: C1020, or JIS H3510, alloy number: C1011), phosphorus-deoxidized copper, and electrolytic copper, and also include a copper alloy, such as Sn-containing copper, Ag-containing copper, a copper alloy having added thereto Cr, Zr, or Mg, and a Corson copper alloy having added thereto Ni, Si, and the like. A known copper alloy may be used. In the description herein, the term "copper foil" used solely encompasses a copper alloy foil.

The thickness of the carrier that can be used in one or more embodiments of the present application is not particularly limited, and may be appropriately controlled to a thickness that is suitable for achieving the function as the carrier, for example, 5 μm or more. The thickness is generally preferably 35 μm or less since the production cost may be increased with a too large thickness. Accordingly, the thickness of the carrier is typically from 8 to 70 μm, more typically from 12 to 70 μm, and more typically from 18 to 35 μm. From the standpoint of the reduction of the raw material cost, the thickness of the carrier is preferably small. Accordingly, the thickness of the carrier is typically 5 μm or more and 35 μm or less, preferably 5 μm or more and 18 μm or less, preferably 5 μm or more and 12 μm or less, preferably 5 μm or more and 11 μm or less, and preferably 5 μm or more and 10 μm or less. In the case where the thickness of the carrier is small, the carrier tends to suffer folding or wrinkle on conveying the foil. For preventing folding or wrinkle from occurring, it is effective, for example, that conveying rolls of a production equipment of the copper foil having a carrier are smoothened, and the distance between one conveying roll and the next conveying roll is shortened. In the case where the copper foil having a carrier is used in an embedded process, which is one of the production methods of a printed wiring board, the carrier necessarily has high rigidity. Accordingly, in the case where the copper foil having a carrier is used in an embedded process, the thickness of the carrier is preferably 18 μm or more and 300 μm or less, preferably 25 μm or more and 150 μm or less, preferably 35 μm or more and 100 μm or less, and further preferably 35 μm or more and 70 μm or less.

On the surface of the carrier opposite to the side having the ultrathin copper layer, a primary particle layer and a secondary particle layer may be provided. The primary particle layer and the secondary particle layer that are provided on the surface of the carrier opposite to the side having the ultrathin copper layer may provide an advantage that on laminating the carrier to a support, such as a resin substrate, from the surface having the primary particle layer and the secondary particle layer, the carrier and the resin substrate can be prevented from being detached from each other.

One example of the production condition in the case where an electrolytic copper foil is used as the carrier is shown below.

Composition of Electrolytic Solution
  Copper: 90 to 110 g/L
  Sulfuric acid: 90 to 110 g/L
  Chlorine: 50 to 100 ppm
  Leveling agent 1 (bis(3-sulfopropyl) disulfide): 10 to 30 ppm
  Leveling agent 2: (amine compound): 10 to 30 ppm The aforementioned amine compound used may be an amine compound represented by the following chemical formula.

The balance of the processing solutions used for electrolysis, surface treatments, plating, and the like in one or more embodiments of the present application is water unless otherwise indicated.

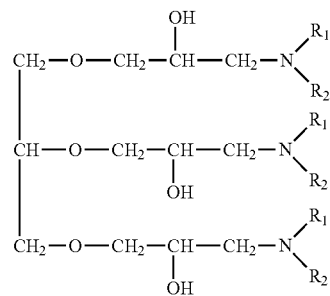

wherein in the chemical formula, $R_1$ and $R_2$ each represent one selected from the group consisting of a hydroxyalkyl group, an ether group, an aryl group, an aromatic-substituted alkyl group, an unsaturated hydrocarbon group, and an alkyl group.

Production Condition
  Current density: 70 to 100 A/dm$^2$
  Temperature of electrolytic solution: 50 to 60° C.
  Linear velocity of electrolytic solution: 3 to 5 m/sec
  Electrolysis time: 0.5 to 10 minutes Intermediate Layer An intermediate layer is provided on the carrier. Other layers may be provided between the carrier and the intermediate layer. The intermediate layer used in one or more embodiments of the present application is not particularly limited, as far as the intermediate layer has such a constitution that the ultrathin copper layer is difficult to detach from the carrier before the laminating process of the copper foil having a carrier to an insulating substrate, but the ultrathin copper layer can be detached from the carrier after the laminating process to the insulating substrate. For example, the intermediate layer of the copper foil having a carrier according to one or more embodiments of the present application may contain one kind or two or more kinds selected from the group consisting of Cr, Ni, Co, Fe, Mo, Ti, W, P, Cu, Al, Zn, alloys thereof, hydrates thereof, oxides thereof, and organic materials thereof. The intermediate layer may contain plural layers.

Furthermore, for example, the intermediate layer may be constituted in the order from the side of the carrier by forming a single metal layer formed of one element selected from the element group consisting of Cr, Ni, Co, Fe, Mo, Ti, W, P, Cu, Al, and Zn, or an alloy layer formed of one kind or two or more kinds of elements selected from the element group consisting of Cr, Ni, Co, Fe, Mo, Ti, W, P, Cu, Al, and Zn, and forming thereon a layer formed of a hydrate, an oxide, or an organic material of one kind or two or more kinds of elements selected from the element group consisting of Cr, Ni, Co, Fe, Mo, Ti, W, P, Cu, Al, and Zn, or a single metal layer formed of one element selected from the element group consisting of Cr, Ni, Co, Fe, Mo, Ti, W, P, Cu, Al, and Zn, or an alloy layer formed of one kind or two or more kinds of elements selected from the element group consisting of Cr, Ni, Co, Fe, Mo, Ti, W, P, Cu, Al, and Zn.

In the case where the intermediate layer is provided only on one surface, a rust preventing layer, such as a Ni plated layer, is preferably provided on the opposite surface of the carrier. In the case where the intermediate layer is provided by a chromate treatment, a zinc chromate treatment, or a plating treatment, it is considered that there are cases where a part of the metal deposited, such as chromium and zinc, is in the form of a hydrate or an oxide.

Furthermore, for example, the intermediate layer may be constituted by laminating nickel, a nickel-phosphorus alloy or a nickel-cobalt alloy, and chromium in this order on the carrier. The adhesion force between nickel and copper is larger than the adhesion force between chromium and copper, and therefore the ultrathin copper layer is detached from the interface between the ultrathin copper layer and chromium. Nickel contained in the intermediate layer is expected to have a barrier effect that prevents the copper component from being diffused from the carrier to the ultrathin copper layer. The deposited amount of nickel in the intermediate layer is preferably 100 $\mu g/dm^2$ or more and 40,000 $\mu g/dm^2$ or less, more preferably 100 $\mu g/dm^2$ or more and 4,000 $\mu g/dm^2$ or less, more preferably 100 $\mu g/dm^2$ or more and 2,500 $\mu g/dm^2$ or less, and more preferably 100 $\mu g/dm^2$ or more and less than 1,000 $\mu g/dm^2$, and the deposited amount of chromium in the intermediate layer is preferably 5 $\mu g/dm^2$ or more and 100 $\mu g/dm^2$ or less.

Ultrathin Copper Layer

An ultrathin copper layer is provided on the intermediate layer. Other layers may be provided between the intermediate layer and the ultrathin copper layer. The ultrathin copper layer may be formed by electroplating utilizing an electrolytic bath, such as copper sulfate, copper pyrophosphate, copper sulfamate, and copper cyanide, and a copper sulfate bath is preferred since the bath is used in an ordinary electrolytic copper foil, and can form a copper foil with a high current density. The thickness of the ultrathin copper layer is not particularly limited, and is generally thinner than the carrier, for example, 12 $\mu m$ or less. The thickness is typically from 0.5 to 12 $\mu m$, more typically from 1 to 5 $\mu m$, further typically from 1.5 to 4 $\mu m$, and further typically from 2 to 3.5 $\mu m$. The ultrathin copper layer may be provided on both surfaces of the carrier.

The usage of the surface-treated copper foil according to one or more embodiments of the present application and/or the copper foil having a carrier according to one or more embodiments of the present application are known by a skilled person in the art, and for example, the surface-treated copper foil and/or the surface of the ultrathin copper layer is adhered to an insulating substrate, such as a phenol resin with a paper base, an epoxy resin with a paper base, an epoxy resin with a synthetic fiber cloth base, an epoxy resin with a glass cloth-paper composite base, an epoxy resin with a glass cloth-class non-woven cloth composite base, an epoxy resin with a glass cloth base, a polyester film, a polyimide film, a liquid crystal polymer, a fluorine resin, a polyamide resin, and a low dielectric polyimide film (followed by detaching the carrier after thermal compression bonding for the copper foil having a carrier), so as to provide a copper-clad laminated board, and the surface-treated copper foil adhered to the insulating substrate and/or the ultra-thin copper layer is etched to a target conductor pattern, thereby finally producing a printed wiring board.

Resin Layer

The surface-treated copper foil according to one or more embodiments of the present application may be a surface-treated copper foil having a resin layer provided on the surface or the outermost surface of the surface treatment layer. The resin layer may be provided on an alloy layer formed of Ni and one or more element selected from the group consisting of Fe, Cr, Mo, Zn, Ta, Cu, Al, P, W, Mn, Sn, As, and Ti, or a chromate treatment layer, or a silane coupling treatment layer, or a Ni—Zn alloy layer. The resin layer is more preferably formed on the outermost surface of the surface treatment layer.

The copper foil having a carrier according to one or more embodiments of the present application may have a resin layer on the primary particle layer or the secondary particle layer, or on the heat resistant layer, the rust preventing layer, the chromate treatment layer, or the silane coupling treatment layer.

The resin layer may be an adhesive, and may be an insulating resin layer in a semi-cured state (B stage) for an adhesive. The semi-cured state (B stage) herein means a state where the surface has no stickiness on touching with fingers, and the insulating resin layer can be stored after stacking, and undergoes curing reaction on receiving a heat treatment.

The resin layer may contain a thermosetting resin or may be a thermoplastic resin. The resin layer may contain a thermoplastic resin. The kinds of the resins are not particularly limited, and preferred examples thereof include resins each containing one or more selected from the group of an epoxy resin, a polyimide resin, a polyfunctional cyanate ester compound, a maleimide compound, a polymaleimide compound, a maleimide resin, an aromatic maleimide resin, a polyvinyl acetal resin, a urethane resin, a polyester sulfone, a polyether sulfone resin, an aromatic polyamide resin, an aromatic polyamide resin polymer, a gum-like resin, a polyamine, an aromatic polyamine, a polyamideimide resin, a rubber-modified epoxy resin, a phenoxy resin, a carboxyl group-modified acrylonitrile-butadiene resin, a polyphenylene oxide, a bismaleimide-triazine resin, a thermosetting polyphenylene oxide resin, a cyanate ester resin, an anhydride of a carboxylic acid, an anhydride of a polybasic carboxylic acid, a linear polymer having a polymerizable functional group, a polyphenylene ether resin, 2,2-bis(4-cyanatophenyl)propane, a phosphorus-containing phenol compound, manganese naphthenate, 2,2-bis(4-glycidylphenyl)propane, a polyphenylene ether-cyanate resin, a siloxane-modified polyamideimide resin, a cyanoester resin, a phosphazene resin, a rubber-modified polyamideimide resin, isoprene, a hydrogenated polybutadiene, a polyvinyl butyral, phenoxy, a high molecular weight epoxy, an aromatic polyamide, a fluorine resin, a bisphenol, a block-copolymerized polyimide resin, and a cyanoester resin.

As the epoxy resin, any resin can be used with no particular problem, as far as the resin has two or more epoxy groups in the molecule and can be used for an electric or electronic purpose. The epoxy resin used is preferably an epoxy resin that is obtained by epoxidizing with a compound having two or more glycidyl groups in the molecule. The epoxy resin used may be one kind of or a mixture of two or more kinds selected from the group consisting of a bisphenol A epoxy resin, a bisphenol F epoxy resin, a bisphenol S epoxy resin, a bisphenol AD epoxy resin, a novolac epoxy resin, a cresol novolac epoxy resin, an alicyclic epoxy resin, a brominated epoxy resin, a phenol novolac epoxy resin, a naphthalene epoxy resin, a brominated bisphenol A epoxy resin, an o-cresol novolac epoxy resin, a rubber-modified bisphenol A epoxy resin, a glycidylamine epoxy resin, triglycidyl isocyanurate, a glycidylamine compound, such as N,N-diglycidylaniline, a glycidyl ester compound, such as diglycidyl tetrahydrophthalate, a phosphorus-containing epoxy resin, a biphenyl epoxy resin, a biphenyl novolac epoxy resin, a trishydroxyphenylmethane epoxy resin, and a tetraphenylethane epoxy resin, and hydrogenated products and halogenated products of the aforementioned epoxy resins may also be used.

The phosphorus-containing epoxy resin used may be a known epoxy resin containing phosphorus. The phosphorus-containing epoxy resin used is preferably, for example, an epoxy resin that is obtained as a derivative from 9,10-dihydro-9-oxa-10-phosphaphenanthrene-10-oxide having two or more epoxy groups in the molecule.

The resin layer may contain known materials, for example, a resin, a resin curing agent, a compound, a curing accelerator, a dielectric material (which may be any dielectric material, e.g., a dielectric material containing an inorganic compound and/or an organic compound, and a dielectric material containing a metal oxide), a reaction catalyst, a crosslinking agent, a polymer, a prepreg, an aggregate, and the like. The resin layer may be formed by a known formation method and a known formation equipment.

The resin may be dissolved, for example, in a solvent, such as methyl ethyl ketone (MEK) and toluene, to form a resin solution, which is coated on the surface-treated copper foil and/or the ultrathin copper layer, or on the surface treatment layer containing the heat resistant layer, the rust preventing layer, the chromate film layer, the silane coupling agent layer, or the like, for example, by a roll coater method, and then the solvent may be removed depending on necessity by heating to provide the B stage. The drying may be performed, for example, with a hot air drying furnace, and the drying temperature may be from 100 to 250° C., and preferably from 130 to 200° C.

The surface-treated copper foil having a resin layer and/or the copper foil having a carrier (i.e., the copper foil having a carrier and a resin) may be used in an embodiment, in which the resin layer is superimposed on a substrate, the whole thereof is thermal compression bonded to thermoset the resin layer, then in the case of the copper foil having a carrier, the carrier is detached to expose the ultrathin copper layer (what is exposed is the surface of the ultrathin copper layer on the side of the intermediate layer), and a prescribed wiring pattern is formed on the surface-treated copper foil or the ultrathin copper layer.

With the use of the surface-treated copper foil having a resin and/or the copper foil having a carrier, the number of sheets of the prepreg material used in production of a multilayer printed wiring board can be decreased. Furthermore, the thickness of the resin layer can be a thickness capable of ensuring interlayer insulation, and a copper-clad laminated board can be produced with no prepreg material used. At this time, moreover, an insulating resin may be undercoated on the surface of the substrate, thereby further improving the smoothness of the surface.

In the case where no prepreg material is used, an economical advantage can be obtained since the material cost of the prepreg material can be saved, and the lamination process can be simplified, and furthermore, another advantage can also be obtained that the thickness of the multilayer printed wiring board to be produced can be decreased by the thickness of the prepreg material, and thereby an ultrathin multilayer printed wiring board having a thickness per one layer of 100 µm or less can be produced.

The thickness of the resin layer is preferably from 0.1 to 80 µm. When the thickness of the resin layer is less than 0.1 µm, the adhesion force may be decreased, and in the case where the copper foil having a carrier and a resin is laminated on a substrate having an inner layer material without interposing a prepreg material therebetween, the interlayer insulation between the inner layer material and the circuit may be difficult to ensure in some cases.

When the thickness of the resin layer exceeds 80 µm or more, on the other hand, it is difficult to form the resin layer having the target thickness by one time of the coating process, which is economically disadvantageous since excessive material cost and man-hour may be needed. Furthermore, the resin layer formed may have poor flexibility, which may facilitate the formation of cracking on handling, and an excessive resin flow may occur in the thermal compression bonding with the inner layer material to make smooth lamination difficult in some cases.

The copper foil having a carrier and a resin in another embodiment as a product may be produced in such a manner that a resin layer is coated on the surface treatment layer of the ultrathin copper layer or on the heat resistant layer, the rust preventing layer, the chromate treatment layer, or the silane coupling treatment layer, and formed into a semi-cured state, and then the carrier is detached to provide a copper foil having a resin with no carrier.

Electronic components and the like may be mounted on the printed wiring board to complete a printed circuit board. In one or more embodiments of the present application, the "printed wiring board" encompasses a printed wiring board, a printed circuit board, and a printed board, each having electronic components and the like mounted thereon.

An electronic apparatus may be produced by using the printed wiring board, an electronic apparatus may be produced by using the printed circuit board having electronic components and the like mounted thereon, and an electronic apparatus may be produced by using the printed board having electronic components and the like mounted thereon. Some examples of the production process of a printed wiring board using the copper foil having a carrier according to one or more embodiments of the present application will be shown below. A printed wiring board can also be produced by using the surface-treated copper foil according to one or more embodiments of the present application as the ultrathin copper layer of the copper foil having a carrier.

One embodiment of the method for producing a printed wiring board according to the present application contains: preparing the copper foil having a carrier according to one or more embodiments of the present application (in which the copper foil having a carrier may read as the "copper foil having a carrier" or the "ultrathin copper layer", and the "side of the ultrathin copper layer" may read as the "side of the surface-treatment layer", so as to produce a printed wiring board, and in this case, the printed wiring board may be produced while the description for the carrier is ignored) and an insulating substrate; laminating the copper foil having a carrier with the insulating substrate; after laminating the copper foil having a carrier with the insulating substrate in such a manner that the side of the ultrathin copper layer faces the insulating substrate, detaching the carrier of the copper foil having a carrier to form a copper-clad laminated board; and then forming a circuit by any of a semi-additive method, a modified semi-additive method, a partly additive method, and a subtractive method. The insulating substrate may have an inner layer circuit built therein.

In one or more embodiments of the present application, the semi-additive method means a method containing: forming thin electroless plating on an insulating substrate or a copper foil seed layer; forming a pattern; and then forming a conductor patter by electroplating or etching.

Accordingly, one embodiment of the method for producing a printed wiring board according to the present application using a semi-additive method contains:

preparing the copper foil having a carrier according to one or more embodiments of the present application and an insulating substrate;

laminating the copper foil having a carrier with the insulating substrate;

after laminating the copper foil having a carrier and the insulating substrate, detaching the carrier of the copper foil having a carrier;

removing the whole ultrathin copper layer that is exposed by detaching the carrier, by a method, such as etching with a corrosive solution, e.g., an acid, or plasma;

providing a through hole and/or a blind via hole in the resin that is exposed by removing the ultrathin copper layer by etching;

performing a desmear treatment in a region including the through hole and/or the blind via hole;

providing an electroless plated layer in a region including the resin and the through hole and/or the blind via hole;

providing a plating resist on the electroless plated layer;

exposing the plating resist, and then removing the plating resist in a region, in which a circuit is to be formed;

providing an electroplated layer in the region, in which a circuit is to be formed, from which the plating resist has been removed;

removing the plating resist; and removing the electroless plated layer in a region except for the region, in which a circuit is to be formed, by flash etching or the like.

Another embodiment of the method for producing a printed wiring board according to the present application using a semi-additive method contains:

preparing the copper foil having a carrier according to one or more embodiments of the present application and an insulating substrate;

laminating the copper foil having a carrier with the insulating substrate;

after laminating the copper foil having a carrier and the insulating substrate, detaching the carrier of the copper foil having a carrier;

providing a through hole and/or a blind via hole in the ultrathin copper layer that is exposed by removing the carrier, and the insulating resin substrate;

performing a desmear treatment in a region including the through hole and/or the blind via hole;

removing the whole ultrathin copper layer that is exposed by detaching the carrier, by a method, such as etching with a corrosive solution, e.g., an acid, or plasma;

providing an electroless plated layer in a region including the resin and the through hole and/or the blind via hole that is exposed by removing the ultrathin copper foil by etching or the like;

providing a plating resist on the electroless plated layer;

exposing the plating resist, and then removing the plating resist in a region, in which a circuit is to be formed;

providing an electroplated layer in the region, in which a circuit is to be formed, from which the plating resist has been removed;

removing the plating resist; and removing the electroless plated layer in a region except for the region, in which a circuit is to be formed, by flash etching or the like.

Still another embodiment of the method for producing a printed wiring board according to the present application using a semi-additive method contains:

preparing the copper foil having a carrier according to one or more embodiments of the present application and an insulating substrate;

laminating the copper foil having a carrier with the insulating substrate;

after laminating the copper foil having a carrier and the insulating substrate, detaching the carrier of the copper foil having a carrier;

providing a through hole and/or a blind via hole in the ultrathin copper layer that is exposed by removing the carrier, and the insulating resin substrate;

removing the whole ultrathin copper layer that is exposed by detaching the carrier, by a method, such as etching with a corrosive solution, e.g., an acid, or plasma;

performing a desmear treatment in a region including the through hole and/or the blind via hole;

providing an electroless plated layer in a region including the resin and the through hole and/or the blind via hole that is exposed by removing the ultrathin copper foil by etching or the like;

providing a plating resist on the electroless plated layer;

exposing the plating resist, and then removing the plating resist in a region, in which a circuit is to be formed;

providing an electroplated layer in the region, in which a circuit is to be formed, from which the plating resist has been removed;

removing the plating resist; and removing the electroless plated layer in a region except for the region, in which a circuit is to be formed, by flash etching or the like.

Still another embodiment of the method for producing a printed wiring board according to the present application using a semi-additive method contains:

preparing the copper foil having a carrier according to one or more embodiments of the present application and an insulating substrate;

laminating the copper foil having a carrier with the insulating substrate;

after laminating the copper foil having a carrier and the insulating substrate, detaching the carrier of the copper foil having a carrier;

removing the whole ultrathin copper layer that is exposed by detaching the carrier, by a method, such as etching with a corrosive solution, e.g., an acid, or plasma;

providing an electroless plated layer on the surface of the resin that is exposed by removing the ultrathin copper foil by etching or the like;

providing a plating resist on the electroless plated layer;

exposing the plating resist, and then removing the plating resist in a region, in which a circuit is to be formed;

providing an electroplated layer in the region, in which a circuit is to be formed, from which the plating resist has been removed;

removing the plating resist; and removing the electroless plated layer in a region except for the region, in which a circuit is to be formed, by flash etching or the like.

In one or more embodiments of the present application, the modified semi-additive method means a method containing: laminating a metal foil on an insulating layer;

protecting a non-circuit-forming portion with a plating resist; forming thick copper on a circuit-forming portion by electroplating; then removing the resist; and removing the metal foil except for the circuit forming portion by (flash) etching to form a circuit on the insulating layer.

Accordingly, one embodiment of the method for producing a printed wiring board according to the present application using a modified semi-additive method contains:

preparing the copper foil having a carrier according to one or more embodiments of the present application and an insulating substrate;

laminating the copper foil having a carrier with the insulating substrate;

after laminating the copper foil having a carrier and the insulating substrate, detaching the carrier of the copper foil having a carrier;

providing a through hole and/or a blind via hole in the ultrathin copper layer that is exposed by detaching the carrier, and the insulating substrate;

performing a desmear treatment in a region including the through hole and/or the blind via hole;

providing an electroless plated layer in a region including the resin and the through hole and/or the blind via hole;

providing a plating resist on the ultrathin copper layer surface that is exposed by detaching the carrier;

after providing the plating resist, forming a circuit by electroplating;

removing the plating resist; and removing the ultrathin copper layer that is exposed by removing the plating resist, by flash etching.

Another embodiment of the method for producing a printed wiring board according to the present application using a modified semi-additive method contains:

preparing the copper foil having a carrier according to one or more embodiments of the present application and an insulating substrate;

laminating the copper foil having a carrier with the insulating substrate;

after laminating the copper foil having a carrier and the insulating substrate, detaching the carrier of the copper foil having a carrier;

providing a plating resist on the surface of the ultrathin copper layer that is exposed by detaching the carrier;

exposing the plating resist, and then removing the plating resist in a region, in which a circuit is to be formed;

providing an electroplated layer in the region, in which a circuit is to be formed, from which the plating resist has been removed;

removing the plating resist; and removing the electroless plated layer and the ultrathin copper layer in a region except for the region, in which a circuit is to be formed, by flash etching or the like.

In one or more embodiments of the present application, the partly additive method means a method for producing a printed wiring board, containing: applying catalyst nuclei to a substrate having a conductive layer provided or a substrate having a through hole or a via hole provided depending on necessity; forming a conductor circuit by etching; providing a soldering resist or a plating resist depending on necessity; and then providing a thick plated layer on the conductor circuit and in the through hole or the via hole by electroless plating.

Accordingly, one embodiment of the method for producing a printed wiring board according to the present application using a partly additive method contains:

preparing the copper foil having a carrier according to one or more embodiments of the present application and an insulating substrate;

laminating the copper foil having a carrier with the insulating substrate;

after laminating the copper foil having a carrier and the insulating substrate, detaching the carrier of the copper foil having a carrier;

providing a through hole and/or a blind via hole in the ultrathin copper layer that is exposed by detaching the carrier, and the insulating substrate;

performing a desmear treatment in a region including the through hole and/or the blind via hole;

applying catalyst nuclei to a region including the through hole and/or the blind via hole;

providing an etching resist on the ultrathin copper layer surface that is exposed by detaching the carrier;

exposing the etching resist to form a circuit pattern;

removing the ultrathin copper layer and the catalyst nuclei by a method, such as etching with a corrosive solution, e.g., an acid, or plasma, so as to form a circuit;

removing the etching resist;

providing a soldering resist or a plating resist on the surface of the insulating substrate that is exposed by removing the ultrathin copper layer and the catalyst nuclei by a method, such as etching with a corrosive solution, e.g., an acid, or plasma; and providing an electroless plated layer in a region, in which the soldering resist or the plating resist is not provided.

In one or more embodiments of the present application, the subtractive method means a method for forming a conductor pattern, containing: selectively removing an unnecessary portion of a copper foil on a copper-clad laminated board, by etching or the like.

Accordingly, one embodiment of the method for producing a printed wiring board according to the present application using a subtractive method contains:

preparing the copper foil having a carrier according to one or more embodiments of the present application and an insulating substrate;

laminating the copper foil having a carrier with the insulating substrate;

after laminating the copper foil having a carrier and the insulating substrate, detaching the carrier of the copper foil having a carrier;

providing a through hole and/or a blind via hole in the ultrathin copper layer that is exposed by detaching the carrier, and the insulating substrate;

performing a desmear treatment in a region including the through hole and/or the blind via hole;

providing an electroless plated layer in a region including the through hole and/or the blind via hole;

providing an electroplated layer on the surface of the electroless plated layer;

providing an etching resist on the surface of the electroplated layer and/or the ultrathin copper layer;

exposing the etching resist to form a circuit pattern;

removing the ultrathin copper layer, the electroless plated layer, and the electroplated layer by a method, such as etching with a corrosive solution, e.g., an acid, or plasma, so as to form a circuit; and removing the etching resist.

Another embodiment of the method for producing a printed wiring board according to the present application using a subtractive method contains:

preparing the copper foil having a carrier according to one or more embodiments of the present application and an insulating substrate;

laminating the copper foil having a carrier with the insulating substrate;

after laminating the copper foil having a carrier and the insulating substrate, detaching the carrier of the copper foil having a carrier;

providing a through hole and/or a blind via hole in the ultrathin copper layer that is exposed by detaching the carrier, and the insulating substrate;

performing a desmear treatment in a region including the through hole and/or the blind via hole;

providing an electroless plated layer in a region including the through hole and/or the blind via hole;

forming a mask on the surface of the electroless plated layer;

providing an electroplated layer on the surface of the electroless plated layer that does not have the mask formed thereon;

providing an etching resist on the surface of the electroplated layer and/or the ultrathin copper layer;

exposing the etching resist to form a circuit pattern;

removing the ultrathin copper layer and the electroless plated layer by a method, such as etching with a corrosive solution, e.g., an acid, or plasma, so as to form a circuit; and removing the etching resist.

The step of providing a through hole and/or a blind via hole and the desmear step subsequent thereto may not be performed.

A specific example of the method for producing a printed wiring board using the copper foil having a carrier according to one or more embodiments of the present application will be described with reference to the drawings below.

As shown in FIG. 1-A, a copper foil having a carrier having an ultrathin copper layer having a roughening treatment layer formed on the surface thereof (first layer) is prepared.

As shown in FIG. 1-B, thereafter, a resist is coated on the roughening treatment layer of the ultrathin copper foil, and is exposed and developed, and thereby the resist is etched to a prescribed shape.

As shown in FIG. 1-C, thereafter, plating for a circuit is formed, and then the resist is removed to form circuit plating having a prescribed shape.

Figure 2:
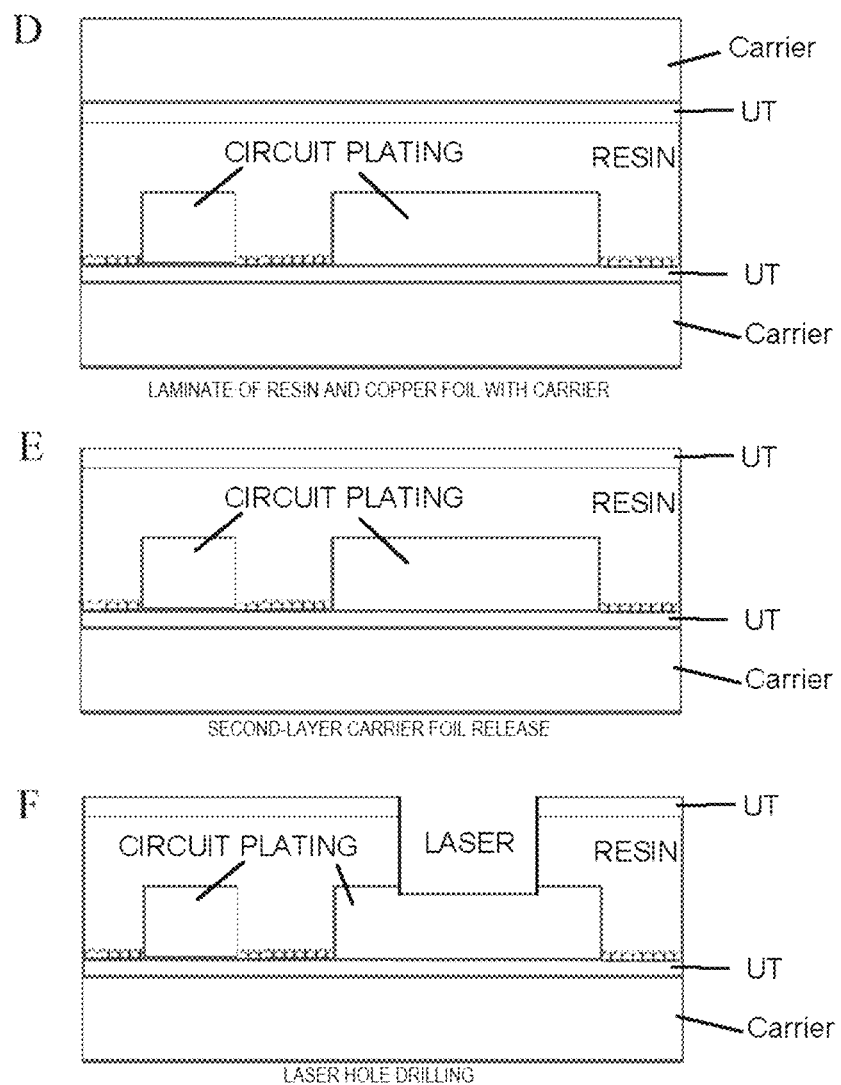
FIG. 2 is a schematic illustration of cross sections D to F of a wiring board in a specific example of a method for producing a printed circuit board using a copper foil having a carrier according to one or more embodiments of the present application, in the steps of from laminating a resin and a second copper foil having a carrier until forming a hole with laser.

As shown in FIG. 2-D, thereafter, an embedding resin is provided on the ultrathin copper layer to cover the circuit plating (to embed the circuit plating), thereby laminating a resin layer, and subsequently another copper foil having a carrier (second layer) is adhered on the side of the ultrathin copper layer.

As shown in FIG. 2-E, thereafter, the carrier is detached from the copper foil having a carrier (second layer).

As shown in FIG. 2-F, thereafter, a hole is formed laser at a prescribed position of the resin layer to expose the circuit plating, thereby forming a blind via hole.

Figure 3:
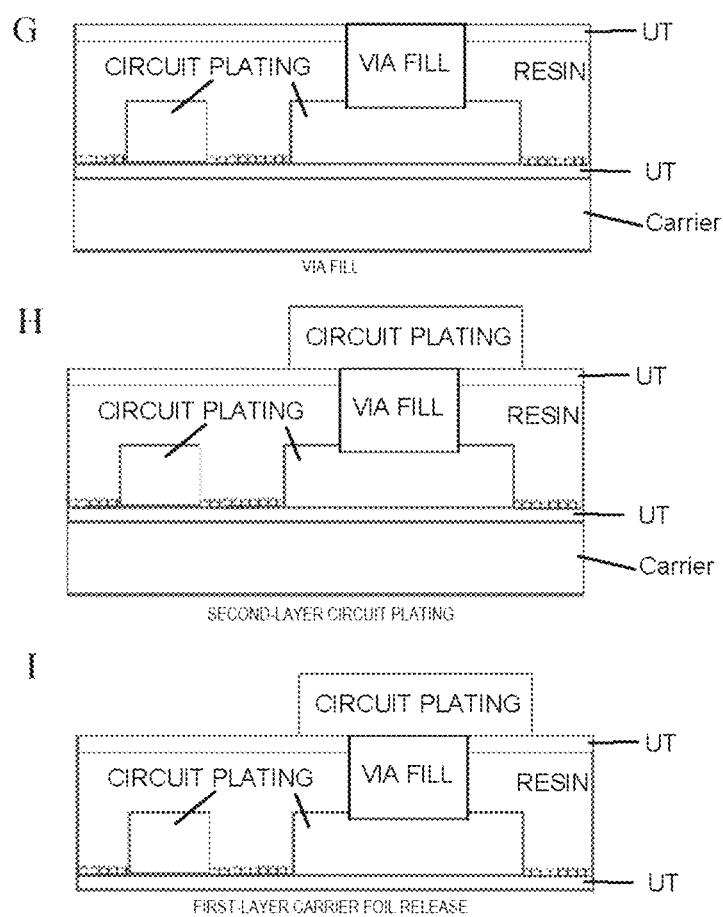
FIG. 3 is a schematic illustration of cross sections G to I of a wiring board in a specific example of a method for producing a printed circuit board using a copper foil having a carrier according to one or more embodiments of the present application, in the steps of from forming a via filling until detaching a first carrier.

As shown in FIG. 3-G, thereafter, copper is embedded in the blind via hole to form a via filling.

As shown in FIG. 3-H, thereafter, circuit plating is formed on the via filling in the manner shown in FIGS. 1-B and 1-C.

As shown in FIG. 3-I, thereafter, the carrier is detached from the copper foil having a carrier (first layer).

Figure 4:
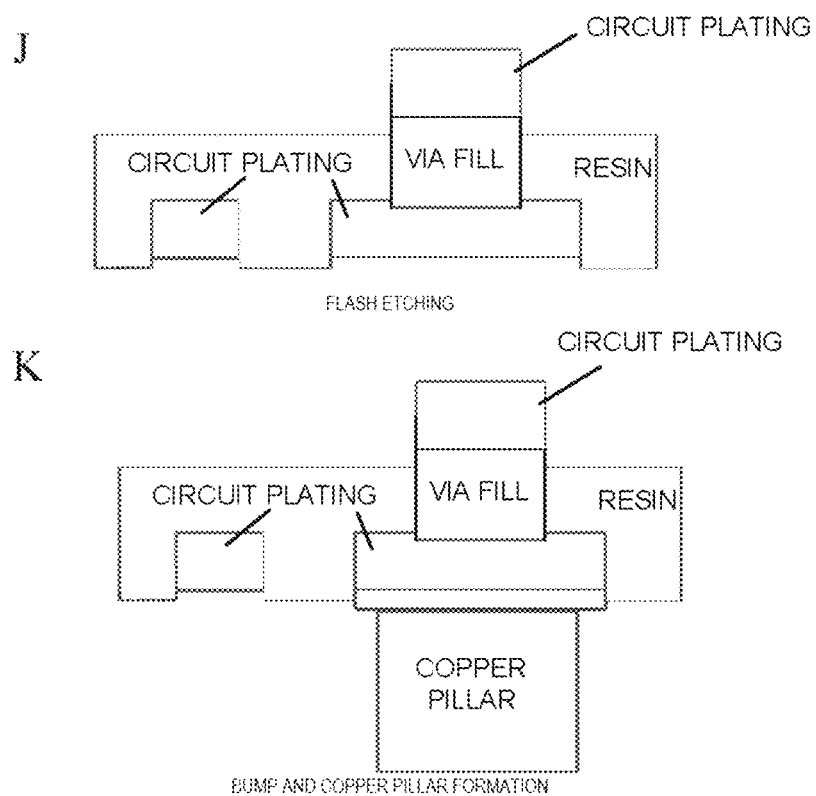
FIG. 4 is a schematic illustration of cross sections J and K of a wiring board in a specific example of a method for producing a printed circuit board using a copper foil having a carrier according to one or more embodiments of the present application, in the steps of from flash etching until forming a bump and a copper pillar.

As shown in FIG. 4-J, thereafter, the ultrathin copper layers on the both surfaces are removed by flash etching to expose the surfaces of the circuit plating in the resin layer.

As shown in FIG. 4-K, thereafter, a bump is formed on the circuit plating in the resin layer, and a copper pillar is formed on the solder. Consequently, a printed circuit board using the copper foil having a carrier according to one or more embodiments of the present application has been produced.

In the method for producing a printed circuit board described above, it is possible that the "ultrathin copper layer" and the "carrier" read as a carrier and an ultrathin copper layer respectively, a circuit is formed on the surface of the copper foil having a carrier on the side of the carrier, and the circuit is embedded with a resin, thereby producing a printed circuit board. In the method for producing a printed circuit board described above, it is also possible that the "copper foil having a carrier having an ultrathin copper layer having a roughening treatment layer formed on the surface thereof" reads as a surface-treated copper foil, a circuit is formed on the surface of the surface-treated copper foil on the side of the surface treatment layer, on the surface of the surface-treated copper foil opposite to the surface treatment layer, the circuit is embedded with a resin, and then the surface-treated copper foil is removed, thereby producing a printed circuit board. In the description herein, the "surface of the surface-treated copper foil on the side of the surface treatment layer" means the surface of the surface-treated copper foil on the side having the surface treatment layer, or in the case where a part or the whole of the surface treatment layer is removed, is the surface of the surface-treated copper foil on the side that previously had the surface treatment layer after removing a part or the whole of the surface treatment layer. Accordingly, the "surface of the surface-treated copper foil on the side of the surface treatment layer" is a concept that encompasses the "outermost surface of the surface treatment layer" and the surface of the surface-treated copper foil after removing a part or the whole of the surface treatment layer.

As the copper foil having a carrier (second layer), the copper foil having a carrier according to one or more embodiments of the present application may be used, an ordinary copper foil having a carrier may be used, or an ordinary copper foil may be used. On the circuit as the second layer shown in FIG. 3-H, one layer or plural layers of circuits may also be formed, and the circuits may be formed by any of a semi-additive method, a subtractive method, a partly additive method, and a modified semi-additive method.

According to the method for producing a printed wiring board described above, since the circuit plating is embedded in the resin layer, the circuit plating is protected with the resin layer to retain the shape thereof in the removal of the ultrathin copper layer by flash etching shown in FIG. 4-J, and a fine circuit can be easily formed. Furthermore, since the circuit plating is protected with the resin layer, the migration resistance of the circuit is enhanced, and thus the conduction of the wiring of the circuit can be favorably suppressed. Accordingly, a fine circuit can be easily formed. Furthermore, since the exposed surface of the circuit plating has a shape depressed from the resin layer after removing the ultrathin copper layer by flash etching as shown in FIGS. 4-J and 4-K, the bump can be easily formed on the circuit plating, and the copper pillar can be easily formed on the bump, thereby enhancing the production efficiency.

The embedding resin used may be a known resin or a known prepreg. Examples thereof used include a prepreg formed of a BT (bismaleimide triazine) resin or a glass cloth impregnated with a BT resin, and ABF Film or ABF, produced by Ajinomoto Fine-Techno Co., Inc. The embedding resin used may be the resin layer and/or the resin and/or the prepreg referred in the description herein.

The copper foil having a carrier used as the first layer may have a substrate or a resin layer on the surface of the copper foil having a carrier. The substrate or the resin layer provided supports the copper foil having a carrier to prevent wrinkles from occurring therein, and thus the productivity can be advantageously enhanced. The substrate or the resin layer may be any of substrates and resin layers that have a function of supporting the copper foil having a carrier used as the first layer. Examples of the substrate or the resin layer include the carrier, the prepreg, and the resin layer referred in the description herein, and a carrier, a prepreg, a resin layer, a metal plate, a metal foil, a plate of an inorganic compound, a foil of an inorganic compound, a plate of an organic compound, and a foil of an organic compound, which are known in the art.

The method for producing a printed wiring board according to one or more embodiments of the present application may be a method for producing a printed wiring board (coreless process) containing: laminating the surface of the copper foil having a carrier according to one or more embodiments of the present application on the side of the ultrathin copper layer or the surface thereof on the side of the carrier with a resin substrate; providing a resin layer and a circuit at least once on the surface of the copper foil having a carrier that is opposite to the surface having the resin substrate laminated on the side of the ultrathin copper layer or the side of the carrier; and after forming the two layers including the resin layer and the circuit, detaching the carrier or the ultrathin copper layer from the copper foil having a carrier. In a specific example of the coreless process, the surface of the copper foil having a carrier according to one or more embodiments of the present application on the side of the ultrathin copper layer or the surface thereof on the side of the carrier is laminated with a resin substrate to produce a laminated material (which may also be referred to as a copper-clad laminated board or a copper-clad laminated material). Thereafter, a resin layer is formed on the surface of the copper foil having a carrier that is opposite to the surface having the resin substrate laminated on the side of the ultrathin copper layer or the side of the carrier. On the resin layer formed on the surface on the side of the carrier or the surface on the side of the ultrathin copper layer, another copper foil having a carrier may be laminated from the side of the carrier or the side of the ultrathin copper layer. In the method for producing a printed wiring board (coreless process), the following laminated materials may also be used, i.e., a laminated material having a resin substrate, a resin, or a prepreg as the center, and on both surfaces of the resin substrate, the resin, or the prepreg, a carrier, an intermediate layer, and an ultrathin copper layer laminated in this order, or an ultrathin copper layer, an intermediate layer, and a carrier laminated in this order; a laminated material having a structure containing "carrier/intermediate layer/ultrathin copper layer/resin substrate, resin, or prepreg/carrier/intermediate layer/ultrathin copper layer" laminated in this order; a laminated material having a structure containing "carrier/intermediate layer/ultrathin copper layer/resin substrate/carrier/intermediate layer/ultrathin copper layer" laminated in this order; and a laminated material having a structure containing "ultrathin copper layer/intermediate layer/carrier/resin substrate/carrier/intermediate layer/ultrathin copper layer" laminated in this order. On the exposed surface of the ultrathin copper layer or the carrier on both surfaces of the laminated material, another resin layer may be provided, a copper layer or a metal layer may be further provided, and then the copper layer or the metal layer may be processed to form a circuit. Furthermore, another resin layer may be provided on the circuit to embed the circuit therewith. The formation of a circuit and a resin layer in this manner may be performed once or more (build-up process). In the laminated material thus formed (which may be hereinafter referred to as a laminated material B), the ultrathin copper layer or the carrier of each of the copper foils having a carrier may be detached from the carrier or the ultrathin copper layer, so as to produce a coreless substrate. In the production of the coreless substrate herein, a laminated material having a structure containing ultrathin copper layer/intermediate layer/carrier/carrier/intermediate layer/ultrathin copper layer described later, a laminated material having a structure containing carrier/intermediate layer/ultrathin copper layer/ultrathin copper layer/intermediate layer/carrier, or a laminated material having a structure containing carrier/intermediate layer/ultrathin copper layer/carrier/intermediate layer/ultrathin copper layer may be produced by using two copper foils having a carrier, and the laminated material may be used as the center. A resin layer and a circuit may be provided once or more on the surface of the ultrathin copper layer or the carrier of the laminated material (which may be hereinafter referred to as a laminated material A), and after providing the resin layer and the circuit once or more, the ultrathin copper layers or the carriers of the copper foils having a carrier may be detached from the carrier or the ultrathin copper layer, so as to produce a coreless substrate. The laminated material may have another additional layer on the surface of the ultrathin copper layer, on the surface of the carrier, between the carrier and the carrier, between the ultrathin copper layer and the ultrathin copper layer, and between the ultrathin copper layer and the carrier. The additional layer may be a resin substrate or a resin layer. In the description herein, in the case where the ultrathin copper layer, the carrier, or the laminated material has an additional layer on the ultrathin copper layer surface, the carrier surface, or the laminated material surface, the "surface of the ultrathin copper layer", the "surface on the side of the ultrathin copper layer", the "ultrathin copper layer surface", the "surface of the carrier", the "surface on the side of the carrier", the "carrier surface", the "surface of the laminated material", and the "laminated material surface" each are a concept that encompasses the surface (outermost surface) of the additional layer. The laminated material preferably has a structure containing ultrathin copper layer/intermediate layer/carrier/carrier/intermediate layer/ultrathin copper layer. When the coreless substrate is produced by using the laminated material, the ultrathin copper layer is disposed on the side of the coreless substrate, and thus a circuit can be easily formed on the coreless substrate by a modified semi-additive method. Furthermore, the ultrathin copper layer can be easily removed since the thickness of the ultrathin copper layer is small, and thus a circuit can be easily formed on the coreless substrate by a semi-additive method after removing the ultrathin copper layer.

In the description herein, the "laminated material" that is not particularly designated as the "laminated material A" or the "laminated material B" means the laminated material that encompasses at least the laminated material A and the laminated material B.

In the production method of a coreless substrate described above, a part or the whole of the end face of the copper foil having a carrier or the laminated material (including the laminated material A) may be covered with a resin, and thereby in the production of a printed wiring board by a build-up process, a chemical solution can be prevented from penetrating between one of the copper foil having a carrier constituting the intermediate layer or the laminated material and another one of the copper foil having a carrier, so as to prevent the separation between the ultrathin copper layer and the carrier and the corrosion of the copper foil having a carrier due to the penetration of the chemical solution, and thus the yield can be enhanced. The "resin that covers a part or the whole of the end face of the copper foil having a carrier" or the "resin that covers a part or the whole of the end face of the laminated material" used may be the resin capable of being used as the resin layer or a known resin. In the production method of a coreless substrate, at least a part of the outer periphery of the laminated portion of the copper foil having a carrier or the laminated material in the planar view of the copper foil having a carrier or the laminated material (i.e., the laminated portion of the carrier and the ultrathin copper layer or the laminated portion of one of the copper foil having a carrier and another one of the copper foil having a carrier) may be covered with a resin or a prepreg. The laminated material formed in the production method of a coreless substrate (i.e., the laminated material A) may be constituted by making one pair of the copper foils having a carrier in contact with each other in a separable manner. The whole of the outer periphery of the laminated portion of the copper foil having a carrier or the laminated material in the planar view of the copper foil having a carrier or the laminated material (i.e., the laminated portion of the carrier and the ultrathin copper layer or the laminated portion of one of the copper foil having a carrier and another one of the copper foil having a carrier) or the whole surface of the laminated portion may be covered with a resin or a prepreg. In the planar view, the resin or the prepreg is preferably larger than the copper foil having a carrier, the laminated material, or the laminated portion of the laminated material, and the laminated material preferably has such a structure that the resin or the prepreg is laminated on both surfaces of the copper foil having a carrier or the laminated material, and the copper foil having a carrier or the laminated material is wrapped around (enveloped) with the resin or the prepreg. By using the structure, in the planar view of the copper foil having a carrier or the laminated material, the laminated portion of the copper foil having a carrier or the laminated material is covered with the resin or the prepreg, so as to prevent another member from hitting against the portion in the lateral direction, i.e., in the lateral direction with respect to the lamination direction, and consequently the detachment between the carrier and the ultrathin copper layer or between the copper foils having a carrier during handling can be reduced. Furthermore, by covering the outer periphery of the copper foil or the laminated portion of the laminated material with a resin or the prepreg, so as to prevent from being exposed, a chemical solution can be prevented from penetrating into the interfaces of the laminated portion in the aforementioned chemical solution treatment process, and thus the copper foil having a carrier can be prevented from being corroded or invaded. In the detachment of one of the copper foil having a carrier from one pair of the copper foils having a carrier of the laminated material, or in the detachment between the carrier and the copper foil (ultrathin copper foil) of the copper foil having a carrier, in the case where the laminated portion of the copper foil having a carrier or the laminated material that is covered with the resin or the prepreg (i.e., the laminated portion of the carrier and the ultrathin copper foil or the laminated portion of one of the copper foil having a carrier and another one of the copper foil having a carrier) is firmly adhered with the resin, the prepreg, or the like, there may be cases where the laminated portion or the like is necessarily removed by cutting or the like.

The copper foil having a carrier according to one or more embodiments of the present application may be laminated from the side of the carrier or the side of the ultrathin copper layer with another one of the copper foil having a carrier according to one or more embodiments of the present application on the side of the carrier or the side of the ultrathin copper foil, so as to constitute a laminated material. The surface on the side of the carrier or the surface on the side of the ultrathin copper layer of the one of the copper foil having a carrier and the surface on the side of the carrier or the surface on the side of the ultrathin copper layer of the another one of the copper foil having a carrier may be laminated directly with each other, via an adhesive depending on necessity, so as to provide a laminated material. The carrier or the ultrathin copper layer of the one of the copper foil having a carrier and the carrier or the ultrathin copper layer of the another one of the copper foil having a carrier may be bonded to each other. In the case where the carrier or the ultrathin copper layer has a surface treatment layer, the "bonding" herein encompasses an embodiment where the carriers or the ultrathin copper layers are bonded through the surface treatment layer. A part or the whole of the end face of the laminated material may be covered with a resin.

The lamination of the carriers with each other, the ultrathin copper layers with each other, the carrier with the ultrathin copper layer, and the copper foils having a carrier with each other may be performed in the following manners, in addition to simple superposition:

(a) metallurgical bonding methods: fusion welding (e.g., arc welding, TIG (tungsten inert gas) welding, MIG (metal inert gas) welding, resistance welding, seam welding, and spot welding), pressure welding (e.g., ultrasonic welding and friction stir welding), and brazing;

(b) mechanical bonding methods: crimping, bonding with rivets (bonding with self-piercing rivets and bonding with rivets), and a stitcher; and (c) physical bonding methods: an adhesive and a (double-sided) adhesive tape.

A laminated material may be produced in such a manner that a part or the whole of one of the carrier and a part or the whole of another one of the carrier or a part or the whole of the ultrathin copper layer are bonded to each other by the aforementioned bonding method, and thereby the one of the carrier is laminated with the another one of the carrier or the ultrathin copper layer, so as to make the carriers or the carrier and the ultrathin copper layer in contact with each other in a separable manner. In the case where the one of the carrier is laminated with the another one of the carrier or the ultrathin copper layer in such a manner that the one of the carrier is weakly bonded to the another one of the carrier or the ultrathin copper layer, the one of the carrier can be detached from the another one of the carrier or the ultrathin copper layer without the removal of the bonded portion of the one of the carrier and the another one of the carrier or the ultrathin copper layer. In the case where the one of the carrier is strongly bonded to the another one of the carrier or the ultrathin copper layer, the one of the carrier can be detached from the another one of the carrier or the ultrathin copper layer by removing the portion where the one of the carrier is bonded to the another one of the carrier or the ultrathin copper layer, by cutting, chemical abrasion (such as etching), mechanical abrasion, or the like.

The laminated material thus constituted may be subjected to a step of providing a resin layer and a circuit at least once and a step of after forming the resin layer and the circuit at least once, detaching the ultrathin copper layer or the carrier from the copper foil having a carrier of the laminated material, so as to provide a printed wiring board having no core. The resin layer and the circuit may be provided on at least one surface of the laminated body, i.e., on one surface or both surfaces of the laminated material.

The resin substrate, the resin layer, the resin, and the prepreg may be the resin layer referred in the description herein, and may contain a resin used in the resin layer referred in the description herein, a resin curing agent, a compound, a curing accelerator, a dielectric material, a reaction catalyst, a crosslinking agent, a polymer, a prepreg, an aggregate, and the like. The copper foil having a carrier or the laminated material in the planar view thereof may be smaller than the resin, the prepreg, the resin substrate, or the resin layer.

The resin substrate is not particularly limited, as far as the resin substrate has such characteristics that can be applied to a printed wiring board and the like, and examples thereof used include a phenol resin with a paper base, an epoxy resin with a paper base, an epoxy resin with a synthetic fiber cloth base, an epoxy resin with a glass cloth-paper composite base, an epoxy resin with a glass cloth-glass non-woven cloth composite base, and an epoxy resin with a glass cloth base for a rigid PWB, and a polyester film, a polyimide film, an LCP (liquid crystal polymer) film, and a fluorine resin for an FPC. In the case where an LCP film or a fluorine resin film is used, there is a tendency that the peel strength between the film and the surface-treated copper foil is smaller than the case where a polyimide film is used. Accordingly, in the case where an LCP film or a fluorine resin film is used, after forming a copper circuit, the copper circuit may be covered with a coverlay to prevent the film and the copper circuit from being detached from each other, and thereby the detachment of the film and the copper circuit due to the decrease of the peel strength can be prevented.

EXAMPLES

The present application will be described with reference to examples and comparative examples below. The examples are only for exemplification, and the present application is not limited to the examples. The present application encompasses other embodiments and modifications within the scope of the present application.

The raw foil used in Example 6 and Comparative Example 4 was a rolled copper foil TPC having a thickness of 12 μm (tough pitch copper defined in JIS H3100, C1100, produced by JX Nippon Mining & Metals Corporation, ten-point average roughness Rz of the surface: 0.7 μm). The raw foil used in Example 7 and Comparative Example 5 was an electrolytic copper foil having a thickness of 12 μm (HLP Foil, produced by JX Nippon Mining & Metals Corporation, ten-point average roughness Rz of the deposition surface (M surface): 0.7 μm) having a surface treatment layer provided on the deposition surface (M surface).

The raw foil used in Examples 1 to 5 and 8 to 15 and Comparative Examples 1 to 3 was a copper foil having a carrier produced in the following manner.

In Examples 1 to 5, 8, and 10 to 15 and Comparative Examples 1 to 3, an electrolytic copper foil having a thickness of 18 μm (JTC Foil, produced by JX Nippon Mining & Metals Corporation) was prepared as a carrier, and in Example 9, the aforementioned standard rolled copper foil TPC having a thickness of 18 μm was prepared as a carrier. An intermediate layer was formed on the surface of the carrier under the following condition, and an ultrathin copper layer having a thickness shown in Table 1 (1 μm or 3 μm) was formed on the surface of the intermediate layer. In the case where the carrier was an electrolytic copper foil, the intermediate layer was formed on the gloss surface (S surface).

Examples 1 to 5 and 8 to 15 and Comparative Examples 1 to 3

Intermediate Layer
(1) Ni Layer (Ni Plating)

The carrier was electroplated under the following condition with a roll-to-roll type continuous plating line to form a Ni layer having a deposited amount of 3,000 μg/dm². The specific plating condition was as follows.

Nickel sulfate: 270 to 280 g/L
Nickel chloride: 35 to 45 g/L
Nickel acetate: 10 to 20 g/L
Boric acid: 30 to 40 g/L
Gloss agent: saccharin, butynediol, etc.
Sodium dodecyl sulfate: 55 to 75 ppm
pH: 4 to 6
Solution temperature: 55 to 65° C.
Current density: 10 A/dm²

(2) Cr Layer (Electrolytic Chromate Treatment)

Subsequently, the surface of the Ni layer formed in the item (1) was rinsed with water and cleaned with an acid, and then subjected to an electrolytic chromate treatment under the following condition with a roll-to-roll type continuous plating line to deposit a Cr layer having a deposited amount of 11 μg/dm² onto the Ni layer.

Potassium bichromate: 1 to 10 g/L, zinc: 0 g/L
pH: 7 to 10
Solution temperature: 40 to 60° C.
Current density: 2 A/dm²

Ultrathin Copper Layer

Subsequently, the surface of the Cr layer formed in the item (2) was rinsed with water and cleaned with an acid, and then subjected to electroplating under the following condition with a roll-to-roll type continuous plating line to form an ultrathin copper layer having a thickness shown in Table 1 (1 μm or 3 μm) on the Cr layer, thereby producing a copper foil having a carrier.

Copper concentration: 90 to 110 g/L
Sulfuric acid concentration: 90 to 110 g/L
Chloride ion concentration: 50 to 90 ppm
Leveling agent 1 (bis(3-sulfopropyl)disulfide): 10 to 30 ppm
Leveling agent 2 (amine compound): 10 to 30 ppm
The leveling agent 2 used was the following amine compound.

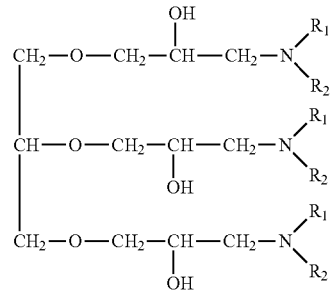

wherein in the chemical formula, $R_1$ and $R_2$ each represent one selected from the group consisting of a hydroxyalkyl group, an ether group, an aryl group, an aromatic-substituted alkyl group, an unsaturated hydrocarbon group, and an alkyl group.

Temperature of electrolytic solution: 50 to 80° C.
Current density: 100 A/dm$^2$
Linear velocity of electrolytic solution: 1.5 to 5 m/sec Roughening Treatment 1 and Roughening Treatment 2

Subsequently, a roughening treatment 1 was performed by using the plating bath shown in Table 3 as described in Table 1. For Examples 3 and 12 to 14 and Comparative Examples 1, 4, and 5, subsequent to the roughening treatment 1, a roughening treatment 2 was performed by using the plating bath shown in Table 3 as described in Table 1.

Heat Resistant Treatment and Rust Preventing Treatment

Subsequently, for Examples 2, 3, and 9 to 14, a heat resistant treatment was performed by using the plating bath shown in Table 4 as described in Table 1. Furthermore, for Examples 9 and 11, a rust preventing treatment was performed by using the plating bath shown in Table 4 as described in Table 1.

Chromate Treatment and Silane Coupling Treatment

Subsequently, for Examples 1 to 5 and 8 to 15 and Comparative Examples 1 to 5, an electrolytic chromate treatment shown below was performed.

Electrolytic Chromate Treatment
Solution composition: potassium dichromate: 1 g/L
Solution temperature: 40 to 60° C.
pH: 0.5 to 10
Current density: 0.01 to 2.6 A/dm$^2$
Electrification time: 0.05 to 30 seconds Thereafter, for Examples 1 to 5, 7, and 9 to 15 and Comparative Examples 1 to 5, a silane coupling treatment was performed with the following diaminosilane.

Silane coupling treatment
Silane coupling agent: N-2-(aminoethyl)-3-aminopropyltrimethoxysilane
Concertation of silane coupling agent: 0.5 to 1.5% by volume
Treatment temperature: 20 to 70° C.
Treatment time: 0.5 to 5 seconds Total Deposited Amount of Surface Treatment Layer Determination of Number of Roughening Particles Before Etching The surfaces having the surface treatment layer of Examples and Comparative Examples each were observed with a scanning electron microscope (SEM) at a magnification of 10,000 to provide a micrograph. In the resulting micrograph, the number of the roughening particles was counted in arbitrary three view fields each having a size of 5 μm×5 μm. The arithmetic average value of the numbers of the roughening particles in the three view fields was designated as the number of roughening particles per one view field. The roughening particle, only a part of which is in the view field, was also counted as the roughening particle.

Etching

Etching was performed for 0.5 second under the following condition.

Etching Condition
Etching method: spray etching
Spray nozzle: full cone nozzle
Spray pressure: 0.10 MPa
Temperature of etching solution: 30° C.
Composition of etching solution:
$H_2O_2$: 18 g/L
$H_2SO_4$: 92 g/L
Cu: 8 g/L
Additives: FE-83011W3C, produced by JCU Corporation, appropriate amount
Balance: water The surface that was not to be etched was masked with an acid resistant tape or a prepreg for preventing invasion with the etching solution.

Measurement of Number of Roughening Particles on Specimen Surface after Etching and Termination Time of Etching The number of the roughening particles on the specimen surface after etching was measured in the same manner as above.

At the time when the number of the roughening particles became 5% or more and 20% or less of the number of the roughening particles before etching, the etching was terminated.

The determination as to whether or not the number of the roughening particles became 5% or more and 20% or less of the number of the roughening particles before etching was made by determining as to whether or not the value A of the following expression became 5% or more and 20% or less.

$A(\%)=((\text{number of roughening particles after etching (per 25 μm}^2))/(\text{number of roughening particles before etching (per 25 μm}^2)))\times 100\%$ The reason why the basis for the termination of etching described above was employed was that in the portion of the specimen surface having no roughening particle present, there were cases where the copper foil or the ultrathin copper layer under the surface treatment layer was etched. In the case where the number of the roughening particles exceeded 20% of the number of the roughening particles before etching, the etching was again performed for 0.5 second. The measurement of the number of the roughening particles and the etching for 0.5 second were repeated until the number of the roughening particles became 20% or less of the number of the roughening particles before etching. In the case where the number of the roughening particles became less than 5% of the number of the roughening particles before etching after the first etching for 0.5 second, the time of etching was changed to any value in a range of 0.05 second or more and 0.4 second or less (for example, 0.05 second, 0.1 second, 0.15 second, 0.2 second, 0.25 second, 0.3 second, 0.35 second, or 0.4 second), and the number of the roughening particles on the specimen surface was measured before and after the etching. The etching time when the number of the roughening particles became 5% or more and 20% or less of the number of the roughening particles before etching was designated as the termination time of etching.

Measurement of Weight of Specimen Before Etching
Size of specimen: sheet of 10 cm square (sheet of 10 cm square punched with pressing machine)
Collection of Specimen: Arbitrary Three Positions A precision balance capable of measuring to four or more digits after the decimal point was used for measuring the weight of the specimen. The resulting measured value of the weight was used directly in the aforementioned calculation.

The precision balance used was IBA-200, produced by AS ONE Corporation. The pressing machine used was HAP-12, produced by Noguchi Press Co., Ltd.

The weight may be measured along with the masking member, such as an acid resistant tape or a prepreg, used in the etching. In this case, the weight is to be measured along with the masking member in the measurement of the weight of the specimen after etching described later. In the case where the specimen is the copper foil having a carrier, the weight may be measured along with the carrier. In this case, the weight is to be measured along with the carrier in the measurement of the weight of the specimen after etching described later.

Measurement of Weight of Specimen after Etching

After masking the surface of the specimen opposite to the side having the surface treatment layer, the surface of the specimen on the side of the surface treatment layer was etched until the termination time of etching. Thereafter, the specimen was measured for weight. The specimen that had been observed with the scanning electron microscope had a larger weight than the actual weight of the specimen since a noble metal, such as platinum, was vapor-deposited thereon in the observation with the scanning electron microscope. Accordingly, for the measurement of the weight of the specimen after etching, the specimen that was not observed with the scanning electron microscope was used. The roughening treatment layer is formed substantially uniformly on the copper foil or the ultrathin copper layer. Accordingly, it was determined that the specimen that was not observed with the scanning electron microscope could be reasonably used.

Calculation of Total Deposited Amount of Surface Treatment Layer

Total deposited amount of surface treatment layer $(g/m^2)$=((weight of specimen of 10 cm square before etching $(g/100\ cm^2)$)−(weight of specimen of 10 cm square after etching $(g/100\ cm^2)$))×100 $(m^2/100\ cm^2)$ The arithmetic average value of the total deposited amounts of three positions of the surface treatment layer was designated as the value of the total deposited amount of the surface treatment layer.

Measurement of Co Content, Ni Content, and Co and Ni Deposited Amounts in Surface Treatment Layer The Co and Ni deposited amounts were measured in such a manner that a specimen having a size of 10 cm×10 cm of Examples and Comparative Examples was dissolved by a thickness of 1 μm from the surface with a nitric acid aqueous solution having a concentration of 20% by mass, and the deposited amounts were measured by ICP emission analysis with an ICP emission spectrographic analyzer, Model SPS 3100, produced by Seiko Instruments, Inc. The arithmetic average values of the Co and Ni deposited amounts of three positions of the specimen were designated as the values of the Co and Ni deposited amounts.

In Examples and Comparative Examples where the surface treatment layers were provided on both surfaces of the copper foil, the surface treatment layer on one of the surfaces was dissolved by masking another one of the surfaces by adhering an acid resistant tape thereto or by thermal compression bonding a prepreg, such as FR4, thereto, and the deposited amounts of Co, Ni, and the other elements were measured. Thereafter, the another one of the surfaces was measured for the deposited amounts of Co, Ni, and the other elements after removing the masking, or another specimen was used, and the another one of the surfaces was measured for the deposited amounts of Co, Ni, and the other elements. The values shown in Table 2 are values for one surface. For the copper foil having the surface treatment layers on both surfaces thereof, the deposited amounts of Co, Ni, and the other elements were the same between the surfaces. In the case where Co, Ni, and the other elements are not dissolved in a nitric acid aqueous solution having a concentration of 20% by mass, Co, Ni, and the other elements may be dissolved with a solution capable of dissolving the elements (for example, a mixed aqueous solution of nitric acid and hydrochloric acid having a nitric acid concentration of 20% by mass and a hydrochloric acid concentration of 12% by mass), and measured by the aforementioned ICP emission analysis. The solution capable of dissolving Co, Ni, and the other elements used may be a known solution, a known acidic solution, or a known alkaline solution.

In the case where the copper foil or the ultrathin copper layer has large unevenness and a thickness of 1.5 μm or less, or the like cases, when the copper foil or the ultrathin copper layer is dissolved by a thickness of 1 μm from the surface on the side of the surface treatment layer, the surface treatment components on the opposite side to the surface treatment layer and the components of the intermediate layer of the copper foil having a carrier may also be dissolved in some cases. In this case, the copper foil or the ultrathin copper layer was dissolved by a thickness of 30% of the thickness of the copper foil or the ultrathin copper layer from the side of the surface treatment layer.

The "deposited amount" of the element means the amount (mass) of the element deposited per unit area (1 $dm^2$ or 1 $m^2$) of the specimen.

The Co content and Ni content in the surface treatment layer were calculated by the following expressions.

Co content in surface treatment layer (%)=((Co deposited amount$(\mu g/dm^2)$)/(total deposited amount of surface treatment layer $(g/m^2)$)×$10^{-4}$ $(g/m^2)/(\mu g/dm^2)$)×100

Ni content in surface treatment layer (%)=((Ni deposited amount$(\mu g/dm^2)$)/(total deposited amount of surface treatment layer $(g/m^2)$)×$10^{-4}$ $(g/m^2)/(\mu g/dm^2)$)×100

Measurement of Ten-Point Average Roughness Rz

The surface roughness Rz (ten-point average roughness) of the surface of the surface treatment layer was measured according to JIS B0601-1982 with a contact surface roughness meter, Stylus Roughness Meter, Surfcorder SE-3C, produced by Kosaka Laboratory Ltd. Arbitrary ten positions were measured for Rz, and the average value of Rz in the ten position was designated as the value of Rz.

Measurement of Transmission Loss

The specimens each were adhered to a liquid polymer resin substrate (formed of a resin as a copolymer of hydroxybenzoic acid (ester) and hydroxynaphthoic acid (ester), thickness: 50 μm, Vecstar CTZ, produced by Kuraray Co., Ltd.), and then a microstrip line was formed by etching to have a characteristic impedance of 50Ω, which was measured for permeability coefficient with a network analyzer, N5247A, produced by Hewlett-Packard Company, so as to obtain a transmission loss at a frequency of 40 GHz. For the specimen that had a thickness of the copper foil of less than 3 μm after laminating the specimen with the liquid crystal polymer resin substrate, the specimen was subjected to copper plating to make a total thickness of the copper foil and the copper plating of 3 μm. For the specimen that had a thickness of the copper foil exceeding 3 μm after laminating the specimen with the liquid crystal polymer resin substrate, the copper foil was etched to a thickness of 3 μm.

Measurement of Peel Strength

The specimens each were adhered on the side of the surface treatment layer to a liquid polymer resin substrate (formed of a resin as a copolymer of hydroxybenzoic acid (ester) and hydroxynaphthoic acid (ester), thickness: 50 μm, Vecstar CTZ, produced by Kuraray Co., Ltd.). Thereafter, for the specimen that was the copper foil having a carrier, the carrier was detached. For the specimen that had a thickness of the copper foil or the ultrathin copper layer of less than 18 µm, the surface of the copper foil or the ultrathin copper layer was subjected to copper plating to make the total thickness of the copper foil or the ultrathin copper layer and the copper plating of 18 µm. For the specimen that had a thickness of the copper foil or the ultrathin copper layer exceeding 18 µm, the copper foil or the ultrathin copper layer was etched to a thickness of 18 µm. The peel strength was measured according to the 90° peeling method (JIS C6471, 8.1) by pulling the liquid crystal polymer resin substrate with a load cell. The peel strength was measured for three specimens for each of Examples and Comparative Examples. The arithmetic average value of the peel strength of the three specimens was designated as the value of the peel strength of Examples and Comparative Examples. The peel strength is desirably 0.5 kN/m or more.

Fine Circuit Formation Capability

The specimens of Examples and Comparative Examples each were adhered to a liquid polymer resin substrate (formed of a resin as a copolymer of hydroxybenzoic acid (ester) and hydroxynaphthoic acid (ester), thickness: 50 µm, Vecstar CTZ, produced by Kuraray Co., Ltd.). Thereafter, for the specimen that was the copper foil having a carrier, the carrier was detached. Thereafter, for the specimen that had a thickness of the copper foil or the ultrathin copper layer of less than 3 µm, the specimen was subjected to copper plating to make a total thickness of the copper foil or the ultrathin copper layer and the copper plating of 3 µm. For the specimen that had a thickness of the copper foil or the ultrathin copper layer exceeding 3 µm, the copper foil was etched to a thickness of 3 µm. Subsequently, a photosensitive resist was coated on the surface of the copper foil or the ultrathin copper layer, or the copper plating on the liquid crystal polymer resin substrate, on which a circuit with 50 lines having L/S=5 µm/5 µm was then printed by an exposure process, and an etching process was performed under the following spray etching condition for removing the unnecessary portion on the surface of the copper foil or the ultrathin copper layer, or the copper plating.

Spray Etching Condition

Etching solution: ferric chloride aqueous solution (Baume degree: 40 degree)

Solution temperature: 60° C.

Spray pressure: 2.0 MPa

Figure 5:
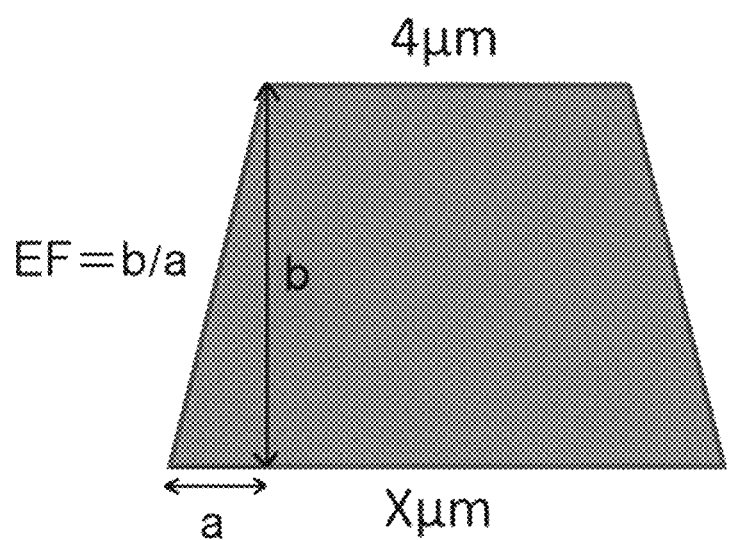
FIG. 5 is a schematic illustration of a horizontal cross section in a width direction and a calculation method of an etching factor of a circuit pattern.

The etching was continued, and at the time when the top width of the circuit became 4 µm, the bottom width of the circuit (i.e., the length of the base X) and the etching factor were evaluated. In the case where the etching results in a circuit having a cross section spreading downward (i.e., sagging occurs), the etching factor means a ration b/a, wherein a is the length from the end of the sagging to the intersection of the resin substrate and the vertical line from the upper surface of the copper foil assuming that the circuit is perpendicularly etched, and b is the thickness of the copper foil. A larger value of the etching factor means that the inclination angle is increased, the etching residue is reduced, and the sagging is decreased. FIG. 5 shows a schematic illustration of the horizontal cross section in the width direction of the circuit pattern, and a summary of the calculation method of the etching factor using the schematic illustration. The length of the base X was measured by SEM observation from above of the circuit, and the etching factor (EF=b/a) was calculated. The value a was calculated by a=(X (µm)−4 (µm))/2. The etching capability can be easily judged by using the etching factor. In one or more embodiments of the present application, a specimen having an etching factor of 6 or more was evaluated as an etching capability of SS, a specimen having an etching factor of 5 or more and less than 6 was evaluated as an etching capability of S, a specimen having an etching factor of 4 or more and less than 5 was evaluated as an etching capability of AA, a specimen having an etching factor of 3 or more and less than 4 was evaluated as an etching capability of A, and a specimen having an etching factor of less than 3 or an etching factor that was uncalculatable was evaluated as an etching capability of B.

Acid Resistance

A polyamic acid (U-Varnish A, produced by Ube Industries, Ltd., BPDA (biphenyltetracarboxylic dianhydride)) was coated on each of the specimens of Examples and Comparative Examples, and was dried at 100° C. and cured at 315° C., so as to provide a copper-clad laminated material having a polyimide resin substrate (BPDA (biphenyltetracarboxylic dianhydride) polyimide) and a copper foil. Thereafter, for the specimen that is the copper foil having a carrier, the ultrathin copper layer was detached from the carrier. Thereafter, for the specimen that had a thickness of the copper foil or the ultrathin copper layer of less than 3 µm, the specimen was subjected to copper plating to make a total thickness of the copper foil or the ultrathin copper layer and the copper plating of 3 µm. For the specimen that had a thickness of the copper foil or the ultrathin copper layer exceeding 3 µm, the copper foil was etched to a thickness of 3 µm. Subsequently, a photosensitive resist was coated on the surface of the copper foil or the ultrathin copper layer, or the copper plating on the polyimide resin substrate, on which a circuit with 50 lines having L/S=5 µm/5 µm was then printed by an exposure process, and an etching process was performed under the following spray etching condition for removing the unnecessary portion on the surface of the copper foil or the ultrathin copper layer, or the copper plating.

Spray Etching Condition

Etching solution: ferric chloride aqueous solution (Baume degree: 40 degree)

Solution temperature: 60° C.

Spray pressure: 2.0 MPa

Figure 6:
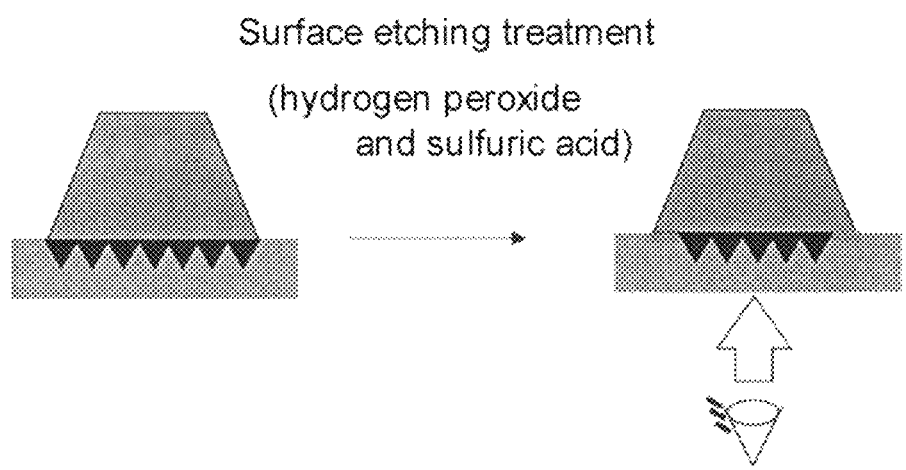
FIG. 6 is a schematic cross sectional illustration of a polyimide resin substrate and a copper circuit in an acid resistance evaluation test in the examples.
Figure 7:
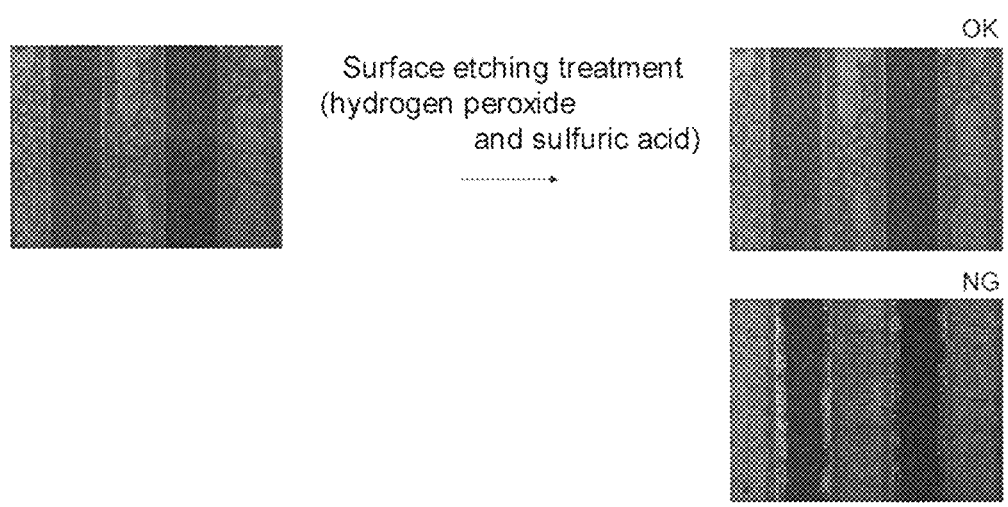
FIG. 7 is a schematic surface illustration of a polyimide resin substrate and a copper circuit in an acid resistance evaluation test in the examples.

The etching was continued until the top width of the circuit became 4 µm. Thereafter, the polyimide resin substrate having a copper circuit was immersed in an aqueous solution containing 10% by weight of sulfuric acid and 2% by weight of hydrogen peroxide for one minute, and then the interface between the polyimide resin substrate and the copper circuit was observed with an optical microscope (see FIGS. 6 and 7). The width of the circuit having been invaded by the aqueous solution of sulfuric acid and hydrogen peroxide was observed, and the acid resistance was evaluated in the following manner. The width of the circuit having been invaded by the aqueous solution of sulfuric acid and hydrogen peroxide is the length of the circuit in the width direction at the position where the circuit is invaded. In the circuit of the specimen observed, the maximum value of the width of the circuit that had been invaded by the aqueous solution of sulfuric acid and hydrogen peroxide was designated as the width of the circuit invaded by the aqueous solution of sulfuric acid and hydrogen peroxide.

The acid resistance was evaluated by the following standard. The specimen that had a width of the circuit invaded by the aqueous solution of sulfuric acid and hydrogen peroxide of less than 0.6 µm was evaluated as "SS". The specimen that had a width of the circuit invaded by the aqueous solution of sulfuric acid and hydrogen peroxide of 0.6 µm or more and less than 0.8 µm was evaluated as "5". The specimen that had a width of the circuit invaded by the aqueous solution of sulfuric acid and hydrogen peroxide of 0.8 μm or more and less than 1.0 μm was evaluated as "AA". The specimen that had a width of the circuit invaded by the aqueous solution of sulfuric acid and hydrogen peroxide of 1.0 μm or more and less than 1.2 μm was evaluated as "A". The specimen that had a width of the circuit invaded by the aqueous solution of sulfuric acid and hydrogen peroxide of 1.2 μm or more was evaluated as "B".

The production conditions and the evaluation results are shown in Tables 1 to 4.

TABLE 1

| | Kind of foil | Thickness of ultrathin copper layer or copper foil (μm) | Roughening treatment 1 | | | Roughening treatment 2 | | |
|---|---|---|---|---|---|---|---|---|
| | | | Plating bath | Current density (A/dm$^2$) | Plating time (sec) | Plating bath | Current density (A/dm$^2$) | Plating time (sec) |
| Example 1 | copper foil having carrier | 3 | Cu—Co—Ni(1) | 20~30 | 1~4 | — | — | — |
| Example 2 | copper foil having carrier | 3 | Cu—Co—Ni(1) | 20~30 | 2~5 | — | — | — |
| Example 3 | copper foil having carrier | 3 | Cu(1) | 40~60 | 2~4 | Cu—Co—Ni(1) | 15~25 | 0.5~3 |
| Example 4 | copper foil having carrier | 3 | Cu—Co—Ni(1) | 15~25 | 1~4 | — | — | — |
| Example 5 | copper foil having carrier | 3 | Cu—Co—Ni(1) | 15~25 | 0.5~3 | — | — | — |
| Example 6 | rolled copper foil | 12 | Cu—Co—Ni(1) | 20~30 | 1~4 | — | — | — |
| Example 7 | electrolytic copper foil | 12 | Cu—Co—Ni(1) | 20~30 | 1~4 | — | — | — |
| Example 8 | copper foil having carrier | 1 | Cu—Co—Ni(1) | 20~30 | 1~4 | — | — | — |
| Example 9 | copper foil having carrier | 3 | Cu(1) | 30~50 | 3~6 | — | — | — |
| Example 10 | copper foil having carrier | 3 | Cu—Ni(1) | 20~30 | 1~4 | — | — | — |
| Example 11 | copper foil having carrier | 3 | Cu(1) | 30~50 | 3~6 | — | — | — |
| Example 12 | copper foil having carrier | 3 | Cu(1) | 40~60 | 2~4 | Cu—Co—Ni(3) | 15~25 | 0.5~3 |
| Example 13 | copper foil having carrier | 3 | Cu(1) | 40~60 | 2~4 | Cu—Co—Ni(3) | 15~25 | 0.2~1.5 |
| Example 14 | copper foil having carrier | 3 | Cu(1) | 40~60 | 2~4 | Cu—Co—Ni(4) | 15~25 | 0.5~3 |
| Example 15 | copper foil having carrier | 3 | Cu—Co—Ni(1) | 15~25 | 0.3~2.5 | — | — | — |
| Comparative Example 1 | copper foil having carrier | 3 | Cu(1) | 50~80 | 3~6 | Cu(2) | 1~5 | 5~15 |
| Comparative Example 2 | copper foil having carrier | 3 | Cu—Co—Ni(2) | 31~40 | 0.5~2 | — | — | — |
| Comparative Example 3 | copper foil having carrier | 3 | Cu—Co(1) | 20~30 | 1~4 | — | — | — |
| Comparative Example 4 | rolled copper foil | 12 | Cu(1) | 50~80 | 3~6 | Cu(2) | 1~5 | 5~15 |
| Comparative Example 5 | electrolytic copper foil | 12 | Cu(1) | 50~80 | 3~6 | Cu(2) | 1~5 | 5~15 |

| | Heat resistant treatment | | | Rust preventing treatment | | | | |
|---|---|---|---|---|---|---|---|---|
| | Plating bath | Current density (A/dm$^2$) | Plating time (sec) | Plating bath | Current density (A/dm$^2$) | Plating time (sec) | Chromate treatment | Silane coupling treatment |
| Example 1 | — | — | — | — | — | — | yes | yes |
| Example 2 | Co—Ni | 1~5 | 2~5 | — | — | — | yes | yes |
| Example 3 | Co—Ni | 1~5 | 2~5 | — | — | — | yes | yes |
| Example 4 | — | — | — | — | — | — | yes | yes |
| Example 5 | — | — | — | — | — | — | yes | yes |
| Example 6 | — | — | — | — | — | — | no | no |
| Example 7 | — | — | — | — | — | — | no | yes |
| Example 8 | — | — | — | — | — | — | yes | no |
| Example 9 | Co—Ni | 1~5 | 2~5 | Zn—Ni | 1~5 | 2~5 | yes | yes |
| Example 10 | Ni—Mo | 1~5 | 2~5 | — | — | — | yes | yes |
| Example 11 | Co—Mo | 1~5 | 2~5 | Zn—Ni | 1~5 | 2~5 | yes | yes |
| Example 12 | Co—Ni | 1~5 | 0.2~0.5 | — | — | — | yes | yes |
| Example 13 | Co—Ni | 1~5 | 0.1~0.3 | — | — | — | yes | yes |
| Example 14 | Co—Ni | 1~5 | 0.2~0.5 | — | — | — | yes | yes |
| Example 15 | — | — | — | — | — | — | yes | yes |
| Comparative Example 1 | — | — | — | — | — | — | yes | yes |
| Comparative Example 2 | — | — | — | — | — | — | yes | yes |

TABLE 1-continued

|  |  |  |  |  |  |  |  |
|---|---|---|---|---|---|---|---|
| Comparative Example 3 | — | — | — | — | — | — | yes | yes |
| Comparative Example 4 | — | — | — | — | — | — | yes | yes |
| Comparative Example 5 | — | — | — | — | — | — | yes | yes |

TABLE 2

|  | Ten-point average roughness Rz of surface on side of surface treatment layer (μm) | Co deposited amount in surface treatment layer (μg/dm2) | Total deposited amount of surface treatment layer (g/m2) | Co content ratio in surface treatment layer (% by mass) | Ni deposited amount in surface treatment layer (μg/dm2) | Ni content ratio in surface treatment layer (% by mass) | Transmission loss at signal frequency of 40 GHz (dB/10 cm) | Peel strength (kN/m) | Fine circuit formation capability | Acid resistance |
|---|---|---|---|---|---|---|---|---|---|---|
| Example 1 | 0.9 | 730 | 1.4 | 5 | 130 | 1 | −6.6 | 0.60 | SS | S |
| Example 2 | 0.9 | 1670 | 1.5 | 11 | 680 | 5 | −6.9 | 0.62 | SS | SS |
| Example 3 | 1.2 | 910 | 4.2 | 2 | 520 | 1 | −7.3 | 0.62 | S | S |
| Example 4 | 0.8 | 570 | 1.1 | 5 | 100 | 1 | −6.4 | 0.58 | SS | S |
| Example 5 | 0.8 | 500 | 1.0 | 5 | 90 | 1 | −6.3 | 0.52 | SS | S |
| Example 6 | 0.9 | 730 | 1.4 | 5 | 130 | 1 | −6.6 | 0.60 | SS | S |
| Example 7 | 0.9 | 730 | 1.4 | 5 | 130 | 1 | −6.6 | 0.60 | SS | S |
| Example 8 | 0.9 | 730 | 1.4 | 5 | 130 | 1 | −6.6 | 0.60 | SS | S |
| Example 9 | 1.2 | 520 | 2.8 | 2 | 350 | 1 | −7.0 | 0.60 | S | S |
| Example 10 | 0.9 | 0 | 1.4 | 0 | 300 | 2 | −6.6 | 0.60 | B | S |
| Example 11 | 1.2 | 520 | 2.8 | 2 | 250 | 1 | −6.9 | 0.60 | S | S |
| Example 12 | 1.2 | 90 | 4.2 | 0.2 | 50 | 0.1 | −7.3 | 0.62 | AA | A |
| Example 13 | 1.2 | 40 | 4.2 | 0.1 | 20 | 0.05 | −7.3 | 0.62 | A | A |
| Example 14 | 1.2 | 90 | 4.2 | 0.2 | 100 | 0.2 | −7.3 | 0.62 | AA | AA |
| Example 15 | 0.8 | 450 | 0.9 | 5 | 75 | 1 | −6.2 | 0.43 | SS | S |
| Comparative Example 1 | 1.6 | 0 | 6.8 | 0 | 0 | 0 | −9.0 | 0.73 | B | B |
| Comparative Example 2 | 0.9 | 2450 | 1.4 | 18 | 1450 | 10 | −8.0 | 0.61 | SS | SS |
| Comparative Example 3 | 0.9 | 950 | 1.4 | 7 | 0 | 0 | −6.7 | 0.61 | SS | B |
| Comparative Example 4 | 1.6 | 0 | 6.8 | 0 | 0 | 0 | −9.0 | 0.73 | B | B |
| Comparative Example 5 | 1.6 | 0 | 6.8 | 0 | 0 | 0 | −9.0 | 0.73 | B | B |

TABLE 3

| Plating bath of roughening treatments 1 and 2 | Composition and condition |
|---|---|
| Cu—Co—Ni(1) | Cu: 10 g/l, Co: 7 g/l, Ni: 7 g/l, 35° C., pH 3.0 |
| Cu—Co—Ni(2) | Cu: 10 g/l, Co: 20 g/l, Ni: 20 g/l, 35° C., pH 3.0 |
| Cu—Co—Ni(3) | Cu: 14 g/l, Co: 1 g/l, Ni: 1 g/l, 35° C., pH 3.0 |
| Cu—Co—Ni(4) | Cu: 14 g/l, Co: 1 g/l, Ni: 3 g/l, 35 ° C., pH 3.0 |
| Cu(1) | Cu: 8 g/l, H2SO4: 50 g/l, 35° C. |
| Cu(2) | Cu: 30 g/l, H2SO4: 90 g/l, 40° C. |
| Cu—Ni(1) | Cu: 10 g/l, Ni: 7 g/l, 35° C., pH 3.0 |
| Cu—Co(1) | Cu: 10 g/l, Co: 7 g/l, 35° C., pH 3.0 |

TABLE 4

| Plating bath of heat resistant treatment and rust preventing treatment | Composition and condition |
|---|---|
| Co—Ni | Co 5~15 g/l, Ni 5~15 g/l, 30~80° C., pH 1.5~3.5 |
| Zn—Ni | Zn 5~30 g/l, Ni 5~30 g/l, 40~50° C., pH 2~5 |
| Ni—Mo | Ni 5~15 g/l, Mo 5~15 g/l, 30~80° C., pH 1.5~3.5 |
| Co—Mo | Co 5~15 g/l, Mo 5~15 g/l, 30~80° C., pH 1.5~3.5 |

Evaluation Results

In all Examples 1 to 15, the transmission loss was favorably suppressed, and the acid resistance was good.

In Comparative Examples 1, 4, and 5, since the content ratio of Ni in the surface treatment layer was 0% by mass, and the ten-point average roughness Rz of the outermost surface of the surface treatment layer exceeded 1.4 μm, the transmission loss was large, and the acid resistance was poor.

In Comparative Example 2, since the content ratio of Ni in the surface treatment layer exceeded 8% by mass, the transmission loss was large.

In Comparative Example 3, since the content ratio of Ni in the surface treatment layer was 0% by mass, the acid resistance was poor.

In the present application, the priority of Japanese Patent Application No. 2017-020508 filed on Feb. 7, 2017 is claimed, and the entire contents of the Japanese Patent Application are incorporated in the present application by reference.

The invention claimed is:

1. A surface-treated copper foil comprising:
a copper foil, and
a surface treatment layer containing a roughening treatment layer on at least one surface of the copper foil, wherein
the surface treatment layer is deposited directly to the copper foil,
the surface treatment layer contains Ni, the surface treatment layer has a content ratio of Ni of 8% by mass or less (excluding 0% by mass),
a total deposited amount of the surface treatment layer is from 1.0 to 5.0 g/m$^2$,
a deposited amount of Ni of the surface treatment layer is less than 150 μg/dm$^2$, and
an outermost surface of the surface treatment layer has a ten-point average roughness Rz of 1.4 μm or less,
the surface treatment layer further contains a heat resistant layer and/or a rust preventing layer, and the heat resistant layer and/or the rust preventing layer is a layer containing Ni and one or more elements selected from the group consisting of zinc, tin, cobalt, molybdenum, copper, tungsten, phosphorus, arsenic, chromium, vanadium, titanium, aluminum, gold, silver, a platinum group element, iron, and tantalum, wherein the content ratio of Ni is defined as ((a deposited amount of Ni (μg/dm$^2$))/(total deposited amount of surface treatment layer (g/m$^2$))×10$^{-4}$ (g/m$^2$)/(μg/dm$^2$))×100.

2. The surface-treated copper foil according to claim 1, wherein the surface treatment layer contains Co, and the surface treatment layer has a content ratio of Co of 15% by mass or less (excluding 0% by mass).

3. The surface-treated copper foil according to claim 1, wherein a deposited amount of Co of the surface treatment layer is from 30 to 2,000 μg/dm$^2$.

4. The surface-treated copper foil according to claim 1, wherein the deposited amount of Ni of the surface treatment layer is from 10 to 140 μg/dm$^2$.

5. The surface-treated copper foil according to claim 1, wherein
the surface treatment layer has a content ratio of Ni of 0.05% by mass or more and 6.0% by mass or less,
the outermost surface of the surface treatment layer has a ten-point average roughness Rz of 1.2 μm or less,
a total deposited amount of the surface treatment layer is from 1.1 to 4.0 g/m$^2$,
the surface treatment layer has a content ratio of Co of 0.01% by mass or more and 10% by mass or less,
a deposited amount of Co of the surface treatment layer is 1,500 μg/dm$^2$ or less, and
the deposited amount of Ni of the surface treatment layer is from 55 to 140 μg/dm$^2$.

6. The surface-treated copper foil according to claim 1, wherein
the surface treatment layer has a content ratio of Ni of 0.15% by mass or more and 4.8% by mass or less,
the outermost surface of the surface treatment layer has a ten-point average roughness Rz of 1.1 μm or less,
a total deposited amount of the surface treatment layer has is from 1.2 to 3.0 g/m$^2$,
the surface treatment layer has a content ratio of Co of 0.01% by mass or more and 6.5% by mass or less,
a deposited amount of Co of the surface treatment layer is 900 μg/dm$^2$ or less, and
the deposited amount of Ni of the surface treatment layer is from 60 to 140 μg/dm$^2$.

7. The surface-treated copper foil according to claim 1, wherein
the surface treatment layer has a content ratio of Ni of 0.15% by mass or more and 4.8% by mass or less,
the outermost surface of the surface treatment layer has a ten-point average roughness Rz of 1.1 μm or less,
a total deposited amount of the surface treatment layer is from 1.2 to 3.0 g/m$^2$,
the surface treatment layer has a content ratio of Co of 3% by mass or more and 6.5% by mass or less,
a deposited amount of Co of the surface treatment layer is from 100 to 900 μg/dm$^2$ or less, and
the deposited amount of Ni of the surface treatment layer is from 60 to 140 μg/dm$^2$.

8. The surface-treated copper foil according to claim 1, wherein the surface treatment layer further contains one or more layer selected from the group consisting of a chromate treatment layer, and a silane coupling treatment layer.

9. The surface-treated copper foil according to claim 1, wherein the surface-treated copper foil is used in a copper-clad laminated board or a printed wiring board for a high frequency circuit board.

10. A surface-treated copper foil having a resin layer, comprising:
the surface-treated copper foil according to claim 1, and
a resin layer.

11. A copper foil having a carrier, comprising a carrier, and an intermediate layer and an ultrathin copper layer on at least one surface of the carrier, wherein the ultrathin copper layer is the surface-treated copper foil according to claim 1, or a surface-treated copper foil having a resin layer, containing the surface-treated copper foil according to claim 1, and a resin layer.

12. A laminated material comprising any one of the following items (13-1) to (13-4):
(13-1) the surface-treated copper foil according to claim 1,
(13-2) a surface-treated copper foil having a resin layer, containing the surface-treated copper foil according to claim 1, and a resin layer,
(13-3) a copper foil having a carrier, containing a carrier, and an intermediate layer and an ultrathin copper layer on at least one surface of the carrier, wherein the ultrathin copper layer is the surface-treated copper foil according to claim 1, and
(13-4) a copper foil having a carrier, containing a carrier, and an intermediate layer and an ultrathin copper layer on at least one surface of the carrier, wherein the ultrathin copper layer is a surface-treated copper foil having a resin layer, containing the surface-treated copper foil according to claim 1, and a resin layer.

13. A laminated material comprising the copper foil having a carrier according to claim 11, and a resin, wherein a part or the whole of an end face of the copper foil having a carrier is covered with the resin.

14. A laminated material comprising two of the copper foils having a carrier according to claim 11.

15. A method for producing a printed wiring board comprising using any one of the following items (16-1) to (16-4):

(16-1) the surface-treated copper foil according to claim 1, (16-2) a surface-treated copper foil having a resin layer, containing the surface-treated copper foil according to claim 1, and a resin layer, (16-3) a copper foil having a carrier, containing a carrier, and an intermediate layer and an ultrathin copper layer on at least one surface of the carrier, wherein the ultrathin copper layer is the surface-treated copper foil according to claim 1, and (16-4) a copper foil having a carrier, containing a carrier, and an intermediate layer and an ultrathin copper layer on at least one surface of the carrier, wherein the ultrathin copper layer is a surface-treated copper foil having a resin layer, containing the surface-treated copper foil according to claim 1, and a resin layer.

16. A method for producing a printed wiring board comprising: the following step (17-1) or (17-2):

(17-1) laminating the surface-treated copper foil according to claim 1 or a surface-treated copper foil having a resin layer, containing the surface-treated copper foil according to claim 1, and a resin layer with an insulating substrate to form a copper-clad laminated board, or (17-2) laminating a copper foil having a carrier of the following item (17-2-1) or (17-2-2) with an insulating substrate, and then detaching the carrier of the copper foil having a carrier to form a copper-clad laminated board, (17-2-1) a copper foil having a carrier, containing a carrier, and an intermediate layer and an ultrathin copper layer on at least one surface of the carrier, wherein the ultrathin copper layer is the surface-treated copper foil according to claim 1, or (17-2-2) a copper foil having a carrier, containing a carrier, and an intermediate layer and an ultrathin copper layer on at least one surface of the carrier, wherein the ultrathin copper layer is a surface-treated copper foil having a resin layer, containing the surface-treated copper foil according to claim 1, and a resin layer; and forming a circuit by any of a semi-additive method, a subtractive method, a partly additive method, and a modified semi-additive method.

17. A method for producing a printed wiring board comprising:

forming a circuit on the surface-treated copper foil according to claim 1 on the side of the surface treatment layer, or forming a circuit on a copper foil having a carrier, containing a carrier, and an intermediate layer and an ultrathin copper layer on at least one surface of the carrier, wherein the ultrathin copper layer is the surface-treated copper foil according to claim 1 on a surface on the side of the ultrathin copper layer or on a surface of the side of the carrier;

forming a resin layer on the surface on the side of the surface treatment layer of the surface-treated copper foil or on the surface on the side of the ultrathin copper layer or the surface on the side of the carrier of the copper foil having a carrier, so as to embed the circuit; and after forming the resin layer, removing the surface-treated copper foil, or detaching the carrier or the ultrathin copper layer, and then removing the ultrathin copper layer or the carrier, so as to expose the circuit having been embedded in the resin layer.

18. A method for producing a printed wiring board comprising:

laminating a resin substrate with the copper foil having a carrier according to claim 11 on a surface on the side of the carrier or on a surface on the side of the ultrathin copper layer;

providing a resin layer and a circuit at least once on a surface of the copper foil having a carrier that is opposite to the surface having the resin substrate laminated; and after forming the resin layer and the circuit, detaching the carrier or the ultrathin copper layer from the copper foil having a carrier.

19. A method for producing a printed wiring board comprising:

providing a resin layer and a circuit at least once on at least one surface of a laminated material containing the copper foil having a carrier according to claim 11; and after forming the resin layer and the circuit, detaching the carrier or the ultrathin copper layer from the copper foil having a carrier constituting the laminated material.

\* \* \* \* \*